US009859099B2

(12) United States Patent
Yamada et al.

(10) Patent No.: US 9,859,099 B2
(45) Date of Patent: Jan. 2, 2018

(54) EXPOSURE APPARATUS AND EXPOSURE METHOD

(71) Applicant: ADVANTEST CORPORATION, Tokyo (JP)

(72) Inventors: Akio Yamada, Gunma (JP); Masahiro Seyama, Gunma (JP); Hideki Nasuno, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/052,881

(22) Filed: Feb. 25, 2016

(65) Prior Publication Data

US 2016/0314934 A1   Oct. 27, 2016

(30) Foreign Application Priority Data

Apr. 27, 2015 (JP) ................... 2015-090454

(51) Int. Cl.
*H01J 37/244* (2006.01)
*H01J 37/20* (2006.01)
(Continued)

(52) U.S. Cl.
CPC .......... *H01J 37/3045* (2013.01); *H01J 37/20* (2013.01); *H01J 37/244* (2013.01);
(Continued)

(58) Field of Classification Search
CPC ...... H01J 37/244; H01J 37/3045; H01J 37/20; H01J 37/3174; H01J 37/1471;
(Continued)

(56) References Cited

U.S. PATENT DOCUMENTS 5,023,462 A * 6/1991 Yamada ................ B82Y 10/00
                                                                                   250/398
5,172,331 A    12/1992 Yamada
(Continued)

FOREIGN PATENT DOCUMENTS

JP   H05-226232 A   9/1993
JP   H06-053127 A   2/1994
(Continued)

OTHER PUBLICATIONS

Extended European Search Report for European Patent Application No. 16 15 7112.0, issued by the European Patent Office dated Jan. 5, 2017.
(Continued)

*Primary Examiner* — David A Vanore

(57) ABSTRACT

Complex and fine patterns may be formed by an exposure apparatus that decreases movement error of a stage including a beam generating section that generates a charged particle beam, a stage section that has a sample mounted thereon and moves the sample relative to the beam generating section, a detecting section that detects a position of the stage section, a predicting section that generates a predicted drive amount obtained by predicting a drive amount of the stage section based on a detected position of the stage section, and an irradiation control section that performs irradiation control for irradiating the sample with the charged particle beam, based on the predicted drive amount.

10 Claims, 20 Drawing Sheets

(51) Int. Cl.
*H01J 37/304* (2006.01)
*H01J 37/317* (2006.01)

(52) U.S. Cl.
CPC ..... *H01J 37/3177* (2013.01); *H01J 2237/043* (2013.01); *H01J 2237/0435* (2013.01); *H01J 2237/15* (2013.01); *H01J 2237/2025* (2013.01); *H01J 2237/20285* (2013.01); *H01J 2237/30455* (2013.01); *H01J 2237/31766* (2013.01); *H01J 2237/31774* (2013.01)

(58) Field of Classification Search
CPC .. H01J 37/1472; H01J 37/304; H01J 37/3177; H01J 37/02302; H01J 37/3175; B82Y 10/00; B82Y 40/00
USPC ....... 250/396 R, 492.2, 398, 440.11, 441.11, 250/442.11, 443.1, 491.1, 492.22
See application file for complete search history.

(56) References Cited

U.S. PATENT DOCUMENTS

| | | | |
|---|---|---|---|
| 5,808,313 | A | 9/1998 | Yamada et al. |
| 7,276,714 | B2 | 10/2007 | Platzgummer et al. |
| 7,897,942 | B1 | 3/2011 | Bareket et al. |
| 8,384,048 | B2* | 2/2013 | Wiesner ............... B82Y 10/00 250/396 R |
| 8,530,857 | B2* | 9/2013 | Ooae .................... F16C 29/025 250/440.11 |
| 2004/0113101 | A1* | 6/2004 | Li ........................ B82Y 10/00 250/492.22 |
| 2006/0022116 | A1 | 2/2006 | Wang |
| 2007/0085027 | A1 | 4/2007 | Baxter et al. |
| 2008/0277598 | A1 | 11/2008 | Satoh et al. |
| 2008/0315112 | A1 | 12/2008 | Wiesner |
| 2013/0011796 | A1 | 1/2013 | Hirata |
| 2013/0056645 | A1 | 3/2013 | Yoshikawa et al. |
| 2013/0082187 | A1 | 4/2013 | Ogasawara |
| 2013/0196517 | A1 | 8/2013 | Tsujita et al. |
| 2013/0266894 | A1* | 10/2013 | Wiesner ............... B82Y 10/00 430/30 |
| 2016/0314934 | A1* | 10/2016 | Yamada .............. H01J 37/3045 |

FOREIGN PATENT DOCUMENTS

| | | |
|---|---|---|
| JP | H8-107059 A | 4/1996 |
| JP | H10-27749 A | 1/1998 |
| JP | 2007-251024 A | 9/2007 |

OTHER PUBLICATIONS

European search report issued for counterpart European Application 16157112.0, issued by European Patent Office dated Oct. 4, 2016.
Noriyuki Hirayanagi et al: "Nikon EB stepper: its System design and preliminary performance", Optical Sensing U, vol. 5037, Jun. 13, 2003 (Jun. 13, 2003), p. 504, XP055303184, 1000 20th St. Bellingham WA 98225-6705 USA ISSN: 0277-786X, DOI: 10.1117/12.484972, ISBN: 978-1-62841-971-9 * pp. 504-508 *.
Office Action issued for counterpart Korean Application 10-2016-0024128, issued by the Korean Intellectual Property Office dated Mar. 28, 2017.
Office Action for European Patent Application No. 16157112.0, issued by the European Patent Office dated Aug. 21, 2017.
Notice of First Office Action for Patent Application No. 201610096405.9 issued by the State Intellectual Property Office of the People's Republic of China (Chinese Patent Office) dated Aug. 1, 2017.
Office Action issued for counterpart Korean Application 10-2016-0024128, issued by the Korean Intellectual Property Office dated Sep. 25, 2017.
Office Action issued for counterpart Taiwanese Application 105105493, issued by the Taiwan Intellectual Property Office dated Sep. 27, 2017.

* cited by examiner

EXPOSURE APPARATUS AND EXPOSURE METHOD

The contents of the following Japanese patent application are incorporated herein by reference:
NO. 2015-090454 filed on Apr. 27, 2015.

BACKGROUND

1. Technical Field

The present invention relates to an exposure apparatus and an exposure method.

2. Related Art

Conventionally, complementary lithography is known for forming a fine wire pattern by performing machining of a simple line pattern formed by optical exposure technology with a line width of tens of nanometers, using a charged particle beam such as an electron beam, as shown in Patent Documents 1 and 2, for example. Furthermore, a multi-beam exposure technique is known using a plurality of charged particle beams, as shown in Patent Documents 3 and 4, for example.

Patent Document 1: Japanese Patent Application Publication No. 2013-16744
Patent Document 2: Japanese Patent Application Publication No. 2013-157547
Patent Document 3: U.S. Pat. No. 7,276,714
Patent Document 4: Japanese Patent Application Publication No. 2013-93566

However, with such techniques, when using multi-beam exposure in which a plurality of charged particle beams are radiated on a pattern, it is difficult to machine line patterns formed with different line widths and different pitches using these beams. On the other hand, there are cases where the semiconductor device to be manufactured cannot be realized simply by machining a simple line pattern having uniform line width and uniform pitch, and therefore technology is desired that enables machining of a line pattern formed with different line widths and different pitches. Furthermore, although the sample is ideally moved with a predetermined velocity relative to the charged particle beams, since a movement error occurs during the actual process, this movement error causes errors in the exposure position and exposure amount.

SUMMARY

Therefore, it is an object of an aspect of the innovations herein to provide an exposure apparatus and an exposure method, which are capable of overcoming the above drawbacks accompanying the related art. The above and other objects can be achieved by combinations described in the claims. According to a first aspect of the present invention, provided is an exposure apparatus comprising a beam generating section that generates a charged particle beam; a stage section that has a sample mounted thereon and moves the sample relative to the beam generating section; a detecting section that detects a position of the stage section; a predicting section that generates a predicted drive amount obtained by predicting a drive amount of the stage section based on a detected position of the stage section; and an irradiation control section that performs irradiation control for irradiating the sample with the charged particle beam, based on the predicted drive amount.

According to a second aspect of the present invention, provided is an exposure method for irradiating a sample with a charged particle beam, comprising generating, with a beam generating section, the charged particle beam; moving, with a stage section that has a sample mounted thereon, the sample relative to the beam generating section; detecting a position of the stage section; generating a predicted drive amount obtained by predicting a drive amount of the stage section based on a detected position of the stage section; performing irradiation control for irradiating the sample with the charged particle beam, based on the predicted drive amount; and deflecting the charged particle beam based on a difference between the detected position of the stage section and a predicted position of the stage section corresponding to the predicted drive amount.

According to a third aspect of the present invention, provided is an exposure method for irradiating a sample with a charged particle beam, comprising generating, with a beam generating section, the charged particle beam; moving, with a stage section that has a sample mounted thereon, the sample relative to the beam generating section; detecting a position of the stage section; generating a predicted drive amount obtained by predicting a drive amount of the stage section based on a detected position of the stage section; and performing irradiation control for irradiating the sample with the charged particle beam, based on the predicted drive amount. The performing irradiation control includes controlling an irradiation amount of the charged particle beam based on a difference between a movement velocity of the stage section and a predicted movement velocity of the stage section.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
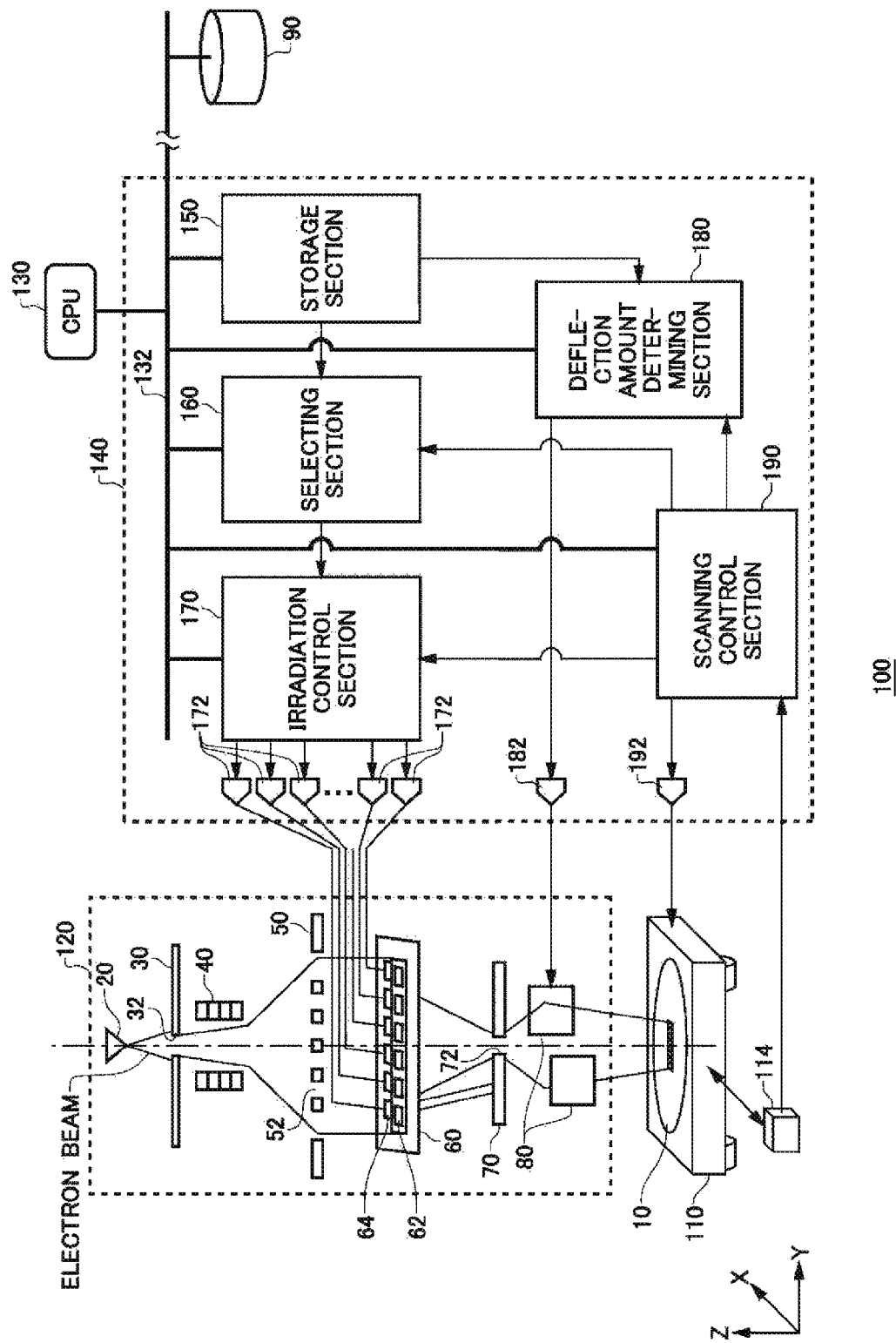
FIG. 1 shows a first exemplary configuration of an exposure apparatus 100 according to an embodiment of the present invention.

FIG. 1 shows a first exemplary configuration of an exposure apparatus 100 according to an embodiment of the present invention. The exposure apparatus 100 radiates a charged particle beam having an irradiation region corresponding to a predetermined grid at a position corresponding to a line pattern on a sample formed with different line widths and different pitches based on the grid, thereby exposing the line pattern. The exposure apparatus 100 includes a stage section 110, a detecting section 114, a column section 120, a CPU 130, and an exposure control section 140.

The stage section 110 has the sample 10 mounted thereon and moves the sample 10. The sample 10 may be a substrate formed of a semiconductor, glass, and/or ceramic, for example, and may be a semiconductor wafer formed of silicon, for example. The sample 10 is a substrate having a line pattern made of a conductive body such as metal formed on the surface thereof. The exposure apparatus 100 of the present embodiment exposes a resist formed on the line pattern in order to cleave and finely machine (e.g. form electrodes, wires, and/or vias in) the line pattern.

The stage section 110 has the sample 10 mounted thereon and moves the sample 10 in the XY plane shown in FIG. 1. The stage section 110 may be an XY stage, or may be a combination including one or more of a Z stage, a rotating stage, and a tilting stage in addition to the XY stage.

The stage section 110 moves in a predetermined direction, which is the longitudinal direction of the line pattern formed on the sample 10. The stage section 110 has the sample 10 mounted thereon such that the longitudinal direction of the line pattern is substantially parallel to the movement direction of the stage, which is the X direction or the Y direction, for example. The present embodiment describes an example in which the stage section 110 is an XY stage that moves in both the X direction and the Y direction, and the sample 10 is mounted such that the longitudinal direction of the line pattern is substantially parallel to the X direction, as shown in FIG. 1.

The detecting section 114 detects the position of the stage section 110. The detecting section 114 detects the position of the stage by irradiating the moving stage with laser light and detecting the reflected light, for example. The detecting section 114 preferably detects the position of the stage with an accuracy of approximately 1 nm or better.

The column section 120 irradiates the sample 10 mounted on the stage section 110 with a charged particle beam having electrons and ions. The present embodiment describes an example in which the column section 120 radiates an electron beam. The column section 120 of the present embodiment is a beam generating section that generates a plurality of charged particle beams having different irradiation positions in the width direction of the line pattern formed on the sample 10. The column section 120 includes an electron gun 20, an aperture plate 30, a beam deforming section 40, an aperture array 50, a blanking section 60, a stopping plate 70, and a deflecting section 80.

The electron gun 20 emits electrons using an electric field or heat, and applies a predetermined electric field to the emitted electrons to accelerate the electrons in the direction of the sample 10, which is the −Z direction in FIG. 1, thereby outputting the electron beam. The electron gun 20 may apply a predetermined acceleration voltage, e.g. 50 keV, to output the electron beam. The electron gun 20 may be provided along a vertical line that is parallel to the Z axis from the front surface of the sample 10, which is parallel to the XY plane.

The aperture plate 30 is provided between the electron gun 20 and the sample 10, and blocks a portion of the electron beam emitted by the electron gun 20. The aperture plate 30 has a circular aperture 32, for example, and blocks a portion of the electron beam with the aperture 32 while allowing the remaining portion of the electron beam to pass. The center of the aperture 32 may be formed in a manner to intersect a vertical line connecting the electron gun 20 and the sample 10. In other words, the aperture plate 30 passes an electron beam within a predetermined emission angle range, from within the electron beam emitted from the electron gun 20.

The beam deforming section 40 is provided between the aperture plate 30 and the sample 10, and deforms the substantially circular cross-sectional shape of the electron beam passed by the aperture plate 30. The beam deforming section 40 may be an electron lens such as an electrostatic quadrupole electrode, for example, and deforms the cross-sectional shape of the electron beam in a manner to become an elliptical shape that extends in one direction. In the example of FIG. 1, the beam deforming section 40 deforms the cross-sectional shape of the electron beam in a manner to have a cross-sectional shape that extends in a direction parallel to the Y axis.

The aperture array 50 is provided between the beam deforming section 40 and the sample 10, and blocks a portion of the electron beam having the cross-sectional shape deformed by the beam deforming section 40. The aperture array 50 has a plurality of apertures 52 lined up in one direction, and blocks a portion of the electron beam with these apertures 52 while passing the rest of the electron beam.

In the example of FIG. 1, the apertures 52 are lined up with predetermined intervals therebetween in the direction parallel to the Y axis, and are cut out in a manner to form a plurality of electron beams having cross-sectional shapes that extend in the direction parallel to the Y axis. The aperture array 50 receives the electron beam input thereto and outputs a resulting electron beam group (referred to as an "array beam" in the present embodiment) in an array corresponding to the apertures 52.

The blanking section 60 is provided between the aperture array 50 and the sample 10, and switches whether each of the plurality of charged particle beams output by the aperture array 50 irradiates the sample 10. Specifically, the blanking section 60 switches whether each beam in the array beam is deflected to have an orientation differing from the direction toward the sample 10. The blanking section 60 includes a plurality of apertures 62 that correspond respectively to the beams in the array beam and are lined up in one direction, and a plurality of blanking electrodes 64 that correspond respectively to the beams in the array beam and apply an electric field within the apertures 62.

In the example of FIG. 1, the apertures 62 are lined up at predetermined intervals in the direction parallel to the Y axis, and each beam of the array beam is passed independently. For example, when voltage is not supplied to a blanking electrode 64, no electric field is applied to the electron beam in the corresponding aperture 62, and therefore the electron beam incident to this aperture 62 is passed in the direction toward the sample 10 without being deflected (this is referred to as a "beam ON" state). Furthermore, when voltage is supplied to a blanking electrode 64, an electric field is generated in the corresponding aperture 62, and therefore the electron beam incident to this aperture 62 is deflected in a direction differing from the direction in which the electron beam travels toward the sample 10 (this is referred to as a "beam OFF" state).

The stopping plate 70 is provided between the blanking section 60 and the sample 10, and blocks the electron beams deflected by the blanking section 60. The stopping plate 70 includes an aperture 72. The aperture 72 may have a substantially elliptical shape or rectangular shape that is extended in one direction, and the center of the aperture 72 may be formed to intersect a straight line connecting the electron gun 20 and the sample 10. In the example of FIG. 1, the aperture 72 has a shape that extends in the direction parallel to the Y axis.

The aperture 72 passes the electron beams that have been passed without being deflected by the blanking section 60, and prevents the progression of electron beams that have been deflected by the blanking section 60. Specifically, the column section 120 combines the blanking section 60 and the stopping plate 70 and controls the voltage supplied to the blanking electrode 64, thereby enabling the column section 120 to switch (blanking operation) whether each electron beam included in the array beams irradiates the sample 10 (the beam ON state) or does not irradiate the sample 10 (the beam OFF state).

The deflecting section 80 is provided between the stopping plate 70 and the sample 10, deflects the plurality of charged particle beams, and adjusts the irradiation position of the array beam irradiating the sample 10. The deflecting section 80 may include a deflector that deflects an electron beam by applying an electric field corresponding to a drive signal input thereto to the electron beam passing therethrough, and may adjust the irradiation position of the array beam by deflecting the array beam. The deflecting section 80 may include one or more electromagnetic coils, and adjust the irradiation position of the array beam by applying a magnetic field to the array beam.

The column section 120 according to the present embodiment described above generates a plurality of electron beams oriented in a predetermined direction, and switches whether each electron beam irradiates the sample 10. In the column section 120, the orientation direction of each of the plurality of electron beams is determined by the direction in which the beam deforming section 40 deforms the cross-sectional shape of the beam, the arrangement direction of the apertures 52 of the aperture array 50, the arrangement direction of the apertures 62 of the blanking section 60 and of the corresponding blanking electrodes 64, and the like.

When these directions substantially match the width direction of the line pattern, which is orthogonal to the movement direction of the stage section 110, the column section 120 mounts the sample 10 such that the movement direction of the stage section 110 substantially matches the longitudinal direction of the line pattern on the sample 10, and therefore a plurality of electron beams are generated with different irradiation positions in the width direction of the line pattern. The present embodiment describes an example in which the column section 120 radiates the array beam oriented in the Y direction, which is a direction perpendicular to the line pattern that is substantially parallel to the X direction.

The CPU 130 controls the overall operation of the exposure apparatus 100. The CPU 130 may have a function of an input terminal that inputs manipulation instructions from a user. The CPU 130 may be a computer, a work station, or the like. The CPU 130 is connected to the exposure control section 140, and controls the exposure operation of the exposure apparatus 100 according to input from the user. For example, the CPU 130 is connected to each component of the exposure control section 140 via a bus 132, and handles control signals and the like.

The exposure control section 140 is connected to the stage section 110 and the column section 120, and controls the stage section 110 and the column section 120 to perform the exposure operation on the sample 10, according to the control signals and the like received from the CPU 130. Furthermore, the exposure control section 140 may be connected to the external storage section 90 via the bus 132, and handle data of patterns stored in the external storage section 90, for example. Instead, the external storage section 90 may be connected directly to the CPU 130. Instead, the exposure control section 140 may include a storage section that stores pattern data or the like therein. The exposure control section 140 includes the storage section 150, a selecting section 160, an irradiation control section 170, a deflection amount determining section 180, and a scanning control section 190.

The storage section 150 stores a cut pattern, which is a pattern for the exposure by the exposure apparatus 100, in order to cut the line pattern formed on the sample 10 and a via pattern, which is a pattern for the exposure by the exposure apparatus 100, in order to form vias in the sample 10. The storage section 150 receives the information concerning the cut pattern and the via pattern from the external storage section 90 and stores this information, for example. The storage section 150 may receive the information concerning the cut pattern and the via pattern input from the user via the CPU 130 and store this information.

The storage section 150 stores configuration information of the sample 10 and configuration information of the line pattern formed on the sample 10. The storage section 150 may store measurement results obtained by performing a measurement in advance as the configuration information, before beginning the exposure operation. For example, the storage section 150 stores, as the configuration information of the sample 10, information concerning sources of positioning error such as contraction (deformation error caused by the manufacturing process), rotational error (caused by transport or the like), warping of the substrate or the like, and height distribution of the sample 10.

Furthermore, the storage section 150 stores, as the configuration information of the line pattern, information relating to misalignment between the irradiation position of the array beam and the position of the line pattern. The storage section 150 preferably sets the configuration information to be configuration information of the sample 10 and configuration information of the line pattern obtained by measuring the sample 10 mounted on the stage section 110. Instead, the storage section 150 may store a past measurement result of the sample 10 or a measurement of another sample in the same batch, for example.

The selecting section 160 is connected to the storage section 150, reads the information of the cut pattern and the via pattern, and identifies the designation of the irradiation positions in the longitudinal direction on the line pattern. The selecting section 160 selects at least one charged particle beam to irradiate the sample 10, from among the plurality of charged particle beams generated by the column section 120, at the designated irradiation positions in the longitudinal direction on the line pattern. The selecting section 160 selects the electron beams to be radiated from within the array beam based on the information of the cut pattern and the via pattern, and provides the irradiation control section 170 with the selection result.

The irradiation control section 170 is connected to the selecting section 160 and receives the selection result of the selecting section 160. The irradiation control section 170 is connected to the column section 120, and controls the at least one selected charged particle beam to irradiate the sample 10. The irradiation control section 170 supplies the blanking electrodes 64 of the blanking section 60 with a signal for switching between the ON state and the OFF state of the electron beam, via the amplifier 172. The amplifier 172 may include an amplification circuit that has a predetermined amplification degree.

The deflection amount determining section 180 is connected to the storage section 150, reads the configuration information of the sample 10 and the configuration information of the line pattern, calculates the adjustment amount by which the irradiation position of the array beam is to be adjusted according to the information concerning the position error of the sample 10 and the irradiation position error of the array beam, and determines a deflection amount corresponding to this adjustment amount. The deflection amount determining section 180 is connected to the column section 120 and adjusts the irradiation position of the array beam based on the determined deflection amount. The deflection amount determining section 180 supplies the deflecting section 80 with a control signal for deflecting the array beam according to the determined deflection amount, via the deflecting section drive circuit 182. Here, the deflecting section drive circuit 182 converts the control signal corresponding to the deflection amount output from the deflection amount determining section 180 into a drive signal that is input to the deflecting section 80.

The scanning control section 190 is connected to the stage section 110 and scans the irradiation positions of the plurality of charged particle beams along the longitudinal direction of the line pattern. The scanning control section 190 according to the present embodiment performs scanning with the array beam along the longitudinal direction of the line pattern by moving the stage section 110 with the sample 10 mounted thereon in a direction substantially parallel to the X direction. The scanning control section 190 supplies a control signal for moving the stage section 110, via the stage drive circuit 192. The stage drive circuit 192 converts the control signal corresponding to the movement amount and the movement direction output from the scanning control section 190 into a corresponding drive signal for the stage section 110.

The scanning control section 190 is connected to the detecting section 114 and receives a detection result of the stage position of the stage section 110. The scanning control section 190 may acquire the movement amount by which the stage section 110 actually moved and the position error of the stage, i.e. the movement error, based on the detection result, and provide feedback for the movement control of the stage section 110. Furthermore, the scanning control section 190 may be connected to the deflection amount determining section 180 and adjust the paths traveled by the charged particle beams according to the movement error of the sample 10 caused by the stage section 110.

The scanning control section 190 is connected to the selecting section 160 and the irradiation control section 170, and supplies the selecting section 160 and the irradiation control section 170 with the position information of the stage section 110. The irradiation control section 170 acquires the timing at which the line pattern of the sample 10 is irradiated by the array beam, based on the position information of the stage section 110.

The scanning control section 190 moves the irradiation position of the array beam in the width direction of the line pattern as well, and performs scanning such that a predetermined region on the surface of the sample 10 becomes the possible irradiation region of the array beam. The following describes an example of the scanning control section 190 performing scanning with the array beam, using FIG. 2.

Figure 2:
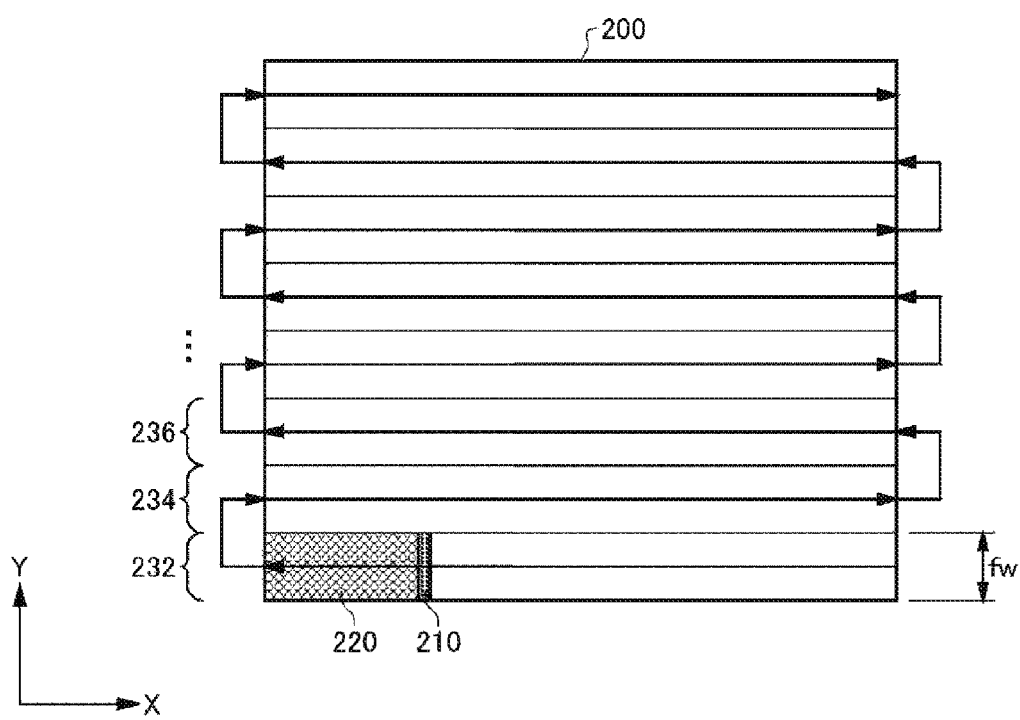
FIG. 2 shows an example of a possible irradiation region 200 formed in a portion of the surface of the sample 10 by the exposure apparatus 100 according to the present embodiment scanning with the array beam.

An example of a possible irradiation region 200 formed in a portion of the surface of the sample 10 by the exposure apparatus 100 according to the present embodiment scanning with the array beam is shown. FIG. 2 shows the surface of the sample 10 substantially parallel to the XY plane, and fw indicates the beam width of the total of all the electron beams lined up in the Y direction of the array beam radiated by the exposure apparatus 100, i.e. the width direction of the line pattern. Here, the beam width fw is substantially 30 µm, for example.

The scanning control section 190 moves the sample 10 in the longitudinal direction of the line pattern using the stage section 110, in a state where the paths travelled by the charged particle beams are maintained. FIG. 2 shows an example in which the scanning control section 190 moves the stage section 110 in the −X direction. In this way, the surface of the sample 10 is scanned by the irradiation position 210 of the array beam scan in the +X direction, and the array beam sets a band-shaped region 220 as the possible irradiation region of the electron beams. Specifically, the scanning control section 190 moves the stage section 110 a predetermined distance in the X direction to set a first frame 232 as the possible irradiation region. Here, the first frame 232 has a surface area of 30 µm by 30 mm, for example.

Next, the scanning control section 190 moves the stage section 110 in the −Y direction by the beam width fw of the array beam, and then moves the stage section 110 back in the +X direction by an amount equal to the predetermined distance that the stage section 110 was previously moved in the −X direction. As a result, a portion of the surface of the sample 10 differing from the first frame 232 is scanned by the irradiation position 210 of the array beam in the −X direction, and a second frame 234 adjacent to the first frame 232 in the +Y direction and having substantially the same surface area as the first frame 232 is set as the possible irradiation region. In the same manner, the scanning control section 190 moves the stage section 110 in the −Y direction by the beam width fw of the array beam, and then moves the stage section 110 in the −X direction by the predetermined distance and sets a third frame 236 as the possible irradiation region.

In this way, the scanning control section 190 moves the stage section 110 back and forth in the X direction, which is the longitudinal direction of the line pattern, and sets a predetermined region on the surface of the sample 10 to be the possible irradiation region 200 of the array beam. Here, the scanning control section 190 sets a 30×30 mm square region to be the possible irradiation region 200.

The present embodiment describes an example in which the scanning control section 190 sets a square region to be the possible irradiation region 200 of the array beam by moving the stage section 110 back and forth, but the present invention is not limited to this, and the scanning control section 190 may perform scanning by deflecting the radiation direction of the array beam. In this case, the scanning control section 190 may supply a deflection amount corresponding to the distance to be scanned to the deflection amount determining section 180 and perform scanning with the array beam. Furthermore, the present embodiment describes an example in which the scanning control section 190 sets the possible irradiation region 200 of the array beam to have a rectangular shape, but the present invention is not limited to this, and a predetermined region formed by the scanning with the array beam may be set as the possible irradiation region 200 of the array beam.

The exposure apparatus 100 according to the present embodiment described above exposes the sample 10 by radiating the array beam corresponding to the irradiation position on the line pattern while moving the stage section 110 back and forth in the X direction, which is the longitudinal direction of the line pattern. In other words, the exposure apparatus 100 irradiates the line pattern within the possible irradiation region 200 of the array beam with charged particle beams at an exposure position corresponding to the cut pattern and the via pattern to be formed. The exposure operation of the exposure apparatus 100 is described below using FIG. 3.

Figure 3:
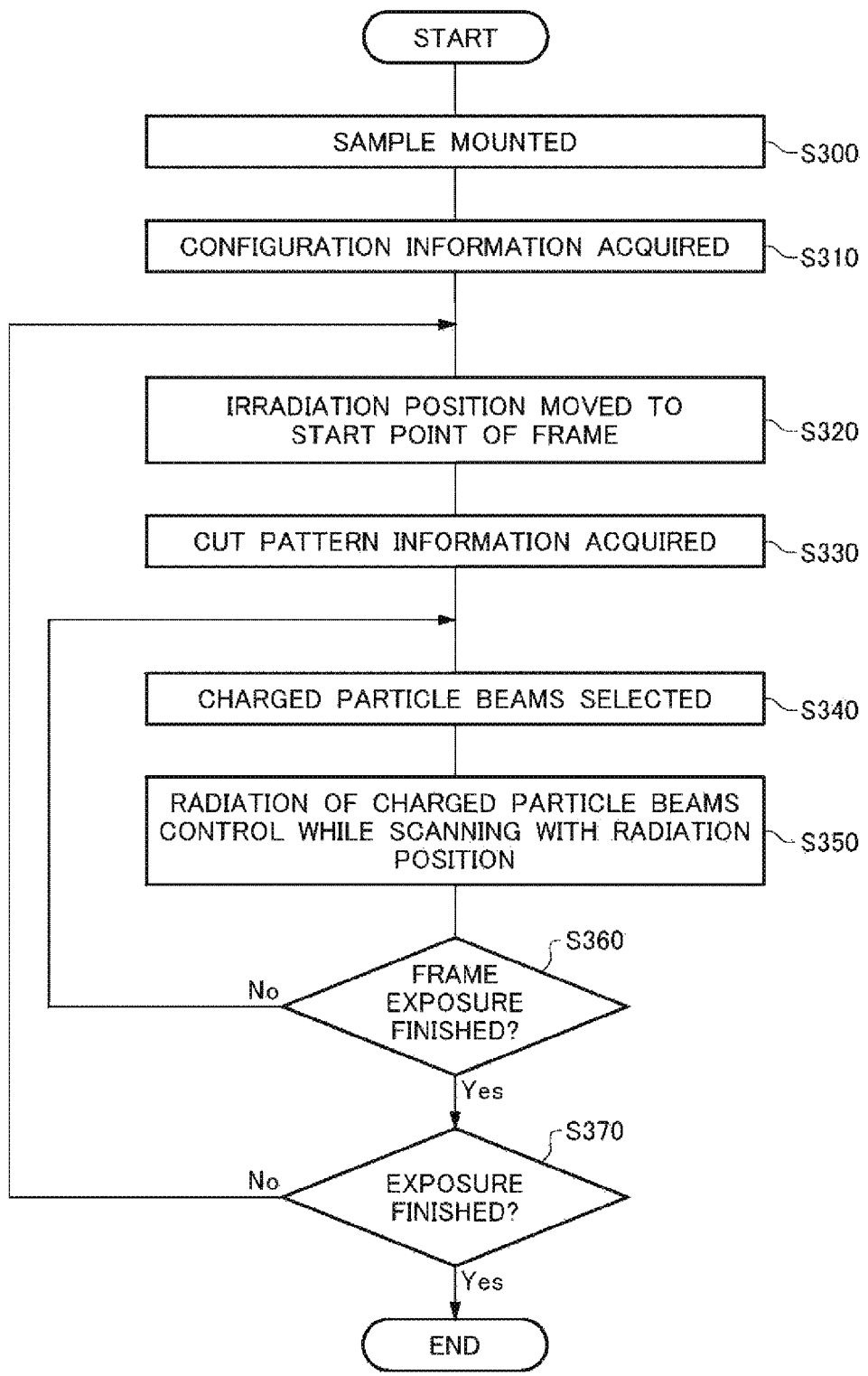
FIG. 3 shows an operational flow of the exposure apparatus 100 according to the present embodiment.

FIG. 3 shows an operational flow of the exposure apparatus 100 according to the present embodiment. The present embodiment describes an example in which the exposure apparatus 100 exposes a cut pattern on the line pattern on the surface of the sample 10, by performing the processes from S300 to S370.

First, the sample 10 that has the line pattern formed thereon and a resist applied thereto is mounted on the stage section 110 (S300). Next, the exposure apparatus 100 acquires the configuration information of the mounted sample 10 and the configuration information of the line pattern (S310). The exposure apparatus 100 stores the acquired configuration information in the storage section 150.

The exposure apparatus 100 acquires the configuration information of the sample 10 and/or the configuration information of the line pattern by observing a plurality of positioning markers or the like provided on the sample 10, for example. In this case, the exposure apparatus 100 may acquire the configuration information of the line pattern by irradiating the positioning markers with the electron beams and detecting the irradiation position of the electron beams and the positions of the positioning markers from a surface image of the sample 10 obtained by detecting secondary electrons or reflected electrons, for example.

The exposure apparatus 100 may acquire the configuration information of the sample 10 by irradiating the positioning markers with laser light, for example, and detecting the reflected light or scattered light. When the exposure apparatus 100 acquires the configuration information of the sample 10 and the configuration information of the line pattern through measurement in this way, the exposure apparatus 100 may further include a detecting section for detecting secondary electrons or reflected electrons, a laser light radiating apparatus, and a light detecting section, for example.

Next, the scanning control section 190 moves the stage section 110 to a position corresponding to a start point of a frame to be exposed, such that the irradiation position of the array beam is positioned at this start point (S320). When the scanning control section 190 moves the stage section 110 in the +X direction, i.e. moves the irradiation position of the array beam in the −X direction, and exposes the frame, the edge of this frame on the +X direction side is set as the start point of the frame. In this way, the stage section 110 has the sample 10 mounted thereon and moves the sample 10 relative to the beam generating section.

When the scanning control section 190 moves the stage section 110 in the −X direction, i.e. moves the irradiation position of the array beam in the +X direction, and exposes the frame, the edge of this frame on the −X direction side is set as the start point of the frame. When the scanning control section 190 moves the stage section 110 back and forth for each frame in the X direction, which is the longitudinal direction of the line pattern, the scanning control section 190 switches between using the edge in the −X direction and using the edge on the +X direction side as the start point of the frame in an alternating manner.

At the beginning stage of the exposure operation, the scanning control section 190 may set the start point of the frame to be a predetermined position. For example, the scanning control section 190 sets the edge on the −X direction side of the frame positioned farthest on the −Y direction side to be the start point of the frame.

Figure 4:
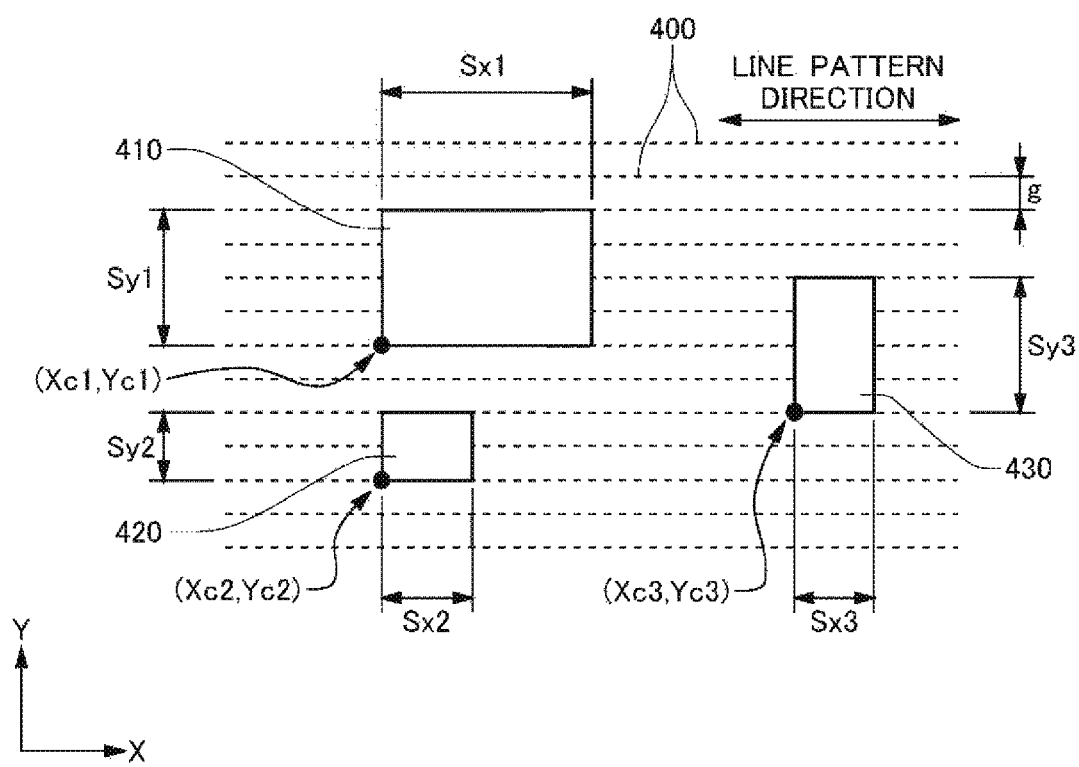
FIG. 4 shows an example of the information of the cut pattern to be formed on the sample 10.

Next, the selecting section 160 acquires from the storage section 150 the information of the cut pattern within the frame to be exposed (S330). FIG. 4 shows an example of the information of the cut pattern to be formed on the sample 10. The information of the cut pattern may include data concerning the position and the size of the cut pattern displayed as a rectangle. FIG. 4 shows an example in which the cut pattern data is the length of two sides of the cut pattern and the coordinates of predetermined portions (each vertex on the −X direction side and −Y direction side, which are the vertices in the lower left portions in the drawing).

More specifically, the {(position), size} of the cut pattern data of a first pattern 410 is shown as {(Xc1, Yc1), Sx1, Sy1}. Similarly, the {(position), size} of the cut pattern data of a second pattern 420 is shown as {(Xc2, Yc2), Sx2, Sy2} and the {(position), size} of the cut pattern data of a third pattern 430 is shown as {(Xc3, Yc3), Sx3, Sy3}.

The X direction in FIG. 4 substantially matches the longitudinal direction of the line pattern, which is the target on which the cut pattern is being imposed. In FIG. 4, the dotted lines parallel to the X direction and arranged at intervals of g in the Y direction are a grid 400 used for designing the line pattern and the cut pattern. For example, the interval g is the grid width, and this grid width g is substantially equal to the minimum value of the line width in the short direction of the line pattern, i.e. the Y direction. Furthermore, when the line pattern has a plurality of different line widths, the line widths are all values that are n times the grid width g, where n is a natural number greater than or equal to 1. Furthermore, the pattern interval in the Y direction between adjacent line patterns is a value that is m times the grid width g, where m is a natural number greater than or equal to 1.

In the same manner, the length of the cut pattern in the Y direction and the pattern interval in the Y direction are each values that are natural number (greater than or equal to 1) multiples of the grid width g. For example, the length of the first pattern 410 in the Y direction is substantially equal to 4 g, the length of the second pattern 420 in the Y direction is substantially equal to 2 g, and the pattern interval in the Y direction between the first pattern 410 and the second pattern 420 is substantially equal to 2 g. Furthermore, in the example of FIG. 4, the Y coordinates of the cut pattern are designed to be substantially equal on the grid 400. In this way, the cut pattern and the line pattern according to the present embodiment have Y coordinates that are designed using the coordinate values of the grid 400 as a reference.

Figure 5:
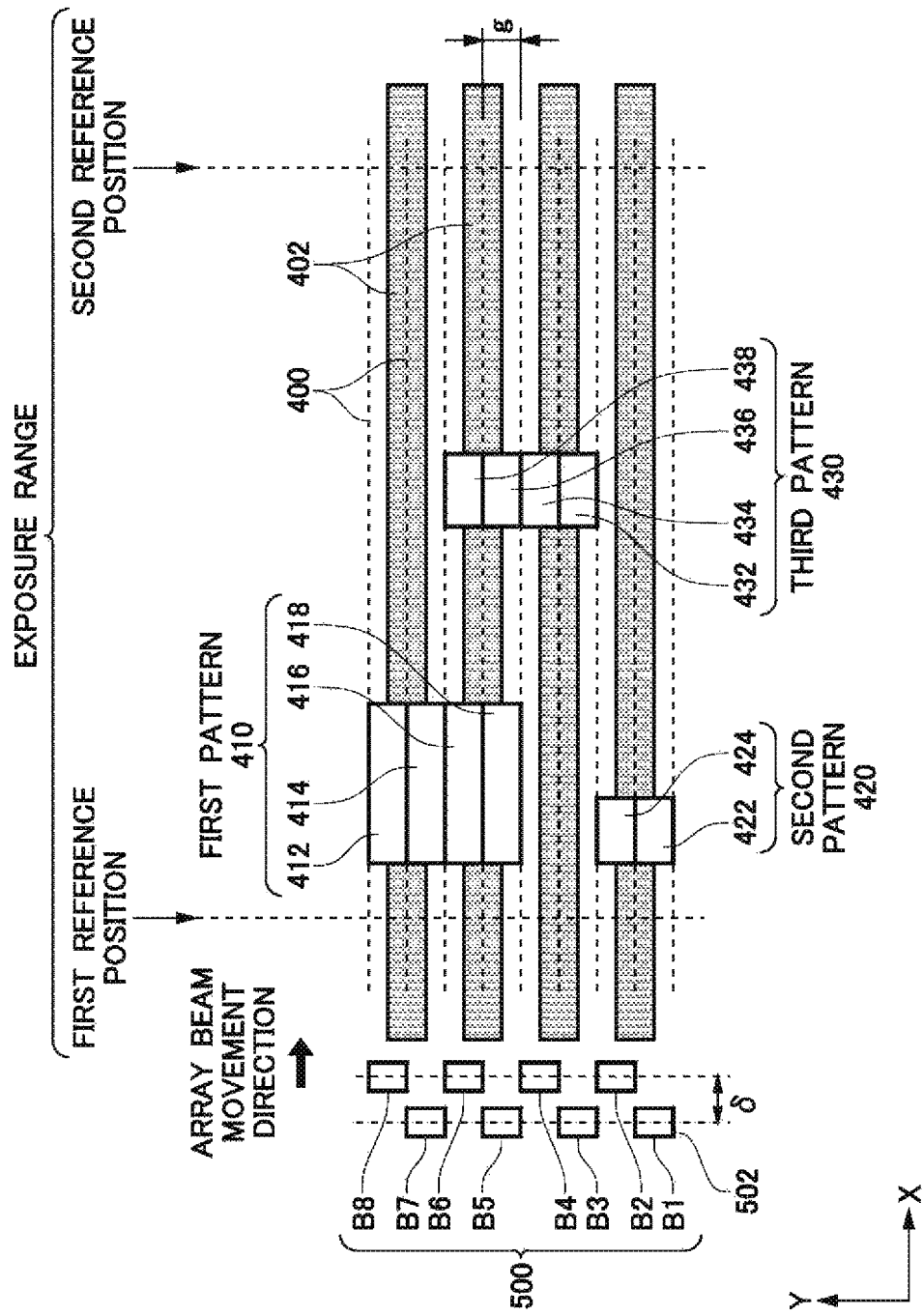
FIG. 5 shows an example in which the scanning control section 190 according to the present embodiment moves the irradiation position of the array beam to the start point of a frame.

FIG. 5 shows an example in which the scanning control section 190 according to the present embodiment moves the irradiation position of the array beam to the start point of a frame, i.e. the edge of the frame on the –X side. Specifically, FIG. 5 is a view of the XY plane showing an example of the positional relationship between the line pattern 402 formed on the surface of the sample and the irradiation position of the array beam 500. Furthermore, FIG. 5 is a view of the XY plane showing examples of the positional relationship between the line pattern 402 and the cut pattern shown in FIG. 4.

The example of FIG. 5 shows a case in which one frame includes four line patterns 402, and the line width of each line pattern 402 and the intervals between adjacent line patterns 402 are both substantially equal to the grid width g of the grid 400. In the drawing, the first pattern 410 is a pattern in which two line patterns 402 from the uppermost portion are cut simultaneously, the second pattern 420 is a pattern in which a line pattern 402 of the bottommost portion is cut, and the third pattern 430 is a pattern in which two line patterns 402 in the center are cut simultaneously.

FIG. 5 shows an example in which the array beam 500 includes a total of eight electron beams B1 to B8. The array beam 500 irradiates each of a plurality of irradiation regions 502 on the sample 10 with an electron beam. The beam width in the width direction of the line patterns, i.e. the Y direction, of each of the electron beams B1 to B8 is substantially equivalent to the grid width g. Furthermore, the irradiation positions of the electron beams B1 to B8 on the sample 10 are arranged at intervals of the grid width g in the Y direction, resulting in a total width of substantially 8 g, such that a range with a width of substantially 8 g in the frame is exposed. In other words, the array beam 500 has a beam width in the Y direction that is a value equal to the product of the number of electron beams in the array beam 500 and the grid width g, and a frame having a width in the Y direction substantially equal to this beam width is exposed.

Here, when the irradiation positions of the plurality of electron beams can be arranged in one column with intervals of the grid width g therebetween, the column section 120 may irradiate the sample 10 with the array beams 500 lined up in this column. Instead, the column section 120 may irradiate the sample 10 with array beams 500 for which the irradiation positions of the electron beams are arranged in a plurality of columns.

FIG. 5 shows an example in which the array beam 500 includes electron beams that are lined up in two columns with an interval δ therebetween in the longitudinal direction of the line pattern. The irradiation positions of the electron beams included in each column are arranged with distances substantially equal to the grid width g therebetween in the width direction of the line pattern. Accordingly, the column including the odd-numbered electron beams B1, B3, B5, and B7, which is referred to as the "first column," has a total width in the Y direction of substantially 7 g. Similarly, the column including the even-numbered electron beams, which is referred to as the "second column," has a total width in the Y direction of substantially 7 g.

At step S320 when the scanning control section 190 moves the irradiation position of the array beam 500 to the start point of the frame, the irradiation positions of the electron beams are arranged respectively between the corresponding grid lines. FIG. 5 shows an example in which the irradiation position of the electron beam B1 arranged first from the –Y direction side is positioned between the first and the second grid lines from the –Y direction side, and the irradiation position of the electron beam Bn arranged n-th from the –Y direction side is positioned between the n-th grid line and the (n+1)-th grid line from the –Y direction side.

In the manner described above, in order to expose the cut pattern designed using the grid 400 coordinate values as a reference, the scanning control section 190 moves the irradiation position of the array beam 500 to positions based on this grid 400. Therefore, the scanning control section 190 can expose a frame having a width of n×g between the corresponding first to (n+1)-th grid lines, by scanning with the irradiation position of the array beam 500s including n electron beams along the longitudinal direction of the line pattern.

Next, the selecting section 160 selects the charged particle beams to be used for the exposure (S340). The selecting section 160 may determine the cut pattern for the exposure based on the information of the irradiation position of the array beam received from the scanning control section 190. The Y coordinates of the cut pattern are designed to be substantially equal on the grid 400, and therefore the selecting section 160 can perform exposure with the first pattern 410 having a width of 4 g by radiating the four electron beams B5 to B8 while scanning with the irradiation position of the array beam 500 along the longitudinal direction of the line pattern, for example.

In other words, in order to perform exposure of the first pattern 410, the selecting section 160 selects the four electron beams B5 to B8 as the electron beams to be used for the exposure. Then, the electron beam B5 is used for exposure of a partial pattern 418 of the first pattern 410, the electron beam B6 is used for exposure of a partial pattern 416 of the first pattern 410, the electron beam B7 is used for exposure of a partial pattern 414 of the first pattern 410, and the electron beam B8 is used for exposure of a partial pattern 412 of the first pattern 410.

Here, the selecting section 160 can select the electron beams to be used for the exposure according to the values of the Y coordinates of the cut pattern. For example, in response to the Y coordinate values of the second pattern 420 being positioned between the first and third grid lines from the –Y direction side, the selecting section 160 selects the electron beams B1 and B2 having irradiation positions in this region. Furthermore, in response to the Y coordinate values of the third pattern 430 being positioned between the third and seventh grid lines from the −Y direction side, the selecting section 160 selects the electron beams B3 to B6 having irradiation positions in this region.

In this way, the electron beam B1 is used for exposure of a partial pattern 422 of the second pattern 420, and the electron beam B2 is used for exposure of a partial pattern 424 of the second pattern 420. Furthermore, the electron beam B3 is used for exposure of a partial pattern 432 of the third pattern 430, the electron beam B4 is used for exposure of a partial pattern 434 of the third pattern 430, the electron beam B5 is used for exposure of a partial pattern 436 of the third pattern 430, and the electron beam B6 is used for exposure of a partial pattern 438 of the third pattern 430.

The selecting section 160 detects the irradiation positions that are to be irradiated by the selected electron beams. The selecting section 160 detects the irradiation positions to be irradiated according to the cut pattern as designated irradiation positions. The selecting section 160 detects the designated irradiation positions according to the time that has passed from when the irradiation positions of a plurality of charged particle beams have passed by predetermined reference positions in the longitudinal direction of the line pattern.

FIG. 5 shows an example of two reference positions determined in advance in the longitudinal direction of the line pattern, which are a first reference position and a second reference position. Specifically, the region between the first reference position and the second reference position is set as the exposure range, and the selecting section 160 detects the designated irradiation position of each of the plurality of electron beams according to the time that has passed from when the irradiation position of the corresponding array beam 500 has passed the first reference position.

In addition to this, three or more reference positions may be set in advance in the longitudinal direction of the line pattern. Specifically, a single frame is divided into a plurality of exposure regions, and the selecting section 160 may detect the designated irradiation position of each of the plurality of electron beams for each exposure range. In this case, the selecting section 160 detects each designated irradiation position according to the reference position that was most recently passed from among the plurality of reference positions in the longitudinal direction of the line pattern by the irradiation position of the charged particle beam and the time that has passed from when this reference position was passed. The selection of the electron beams by the selecting section 160 and the detection of the irradiation positions is described below using FIGS. 6 and 7.

Figure 6:
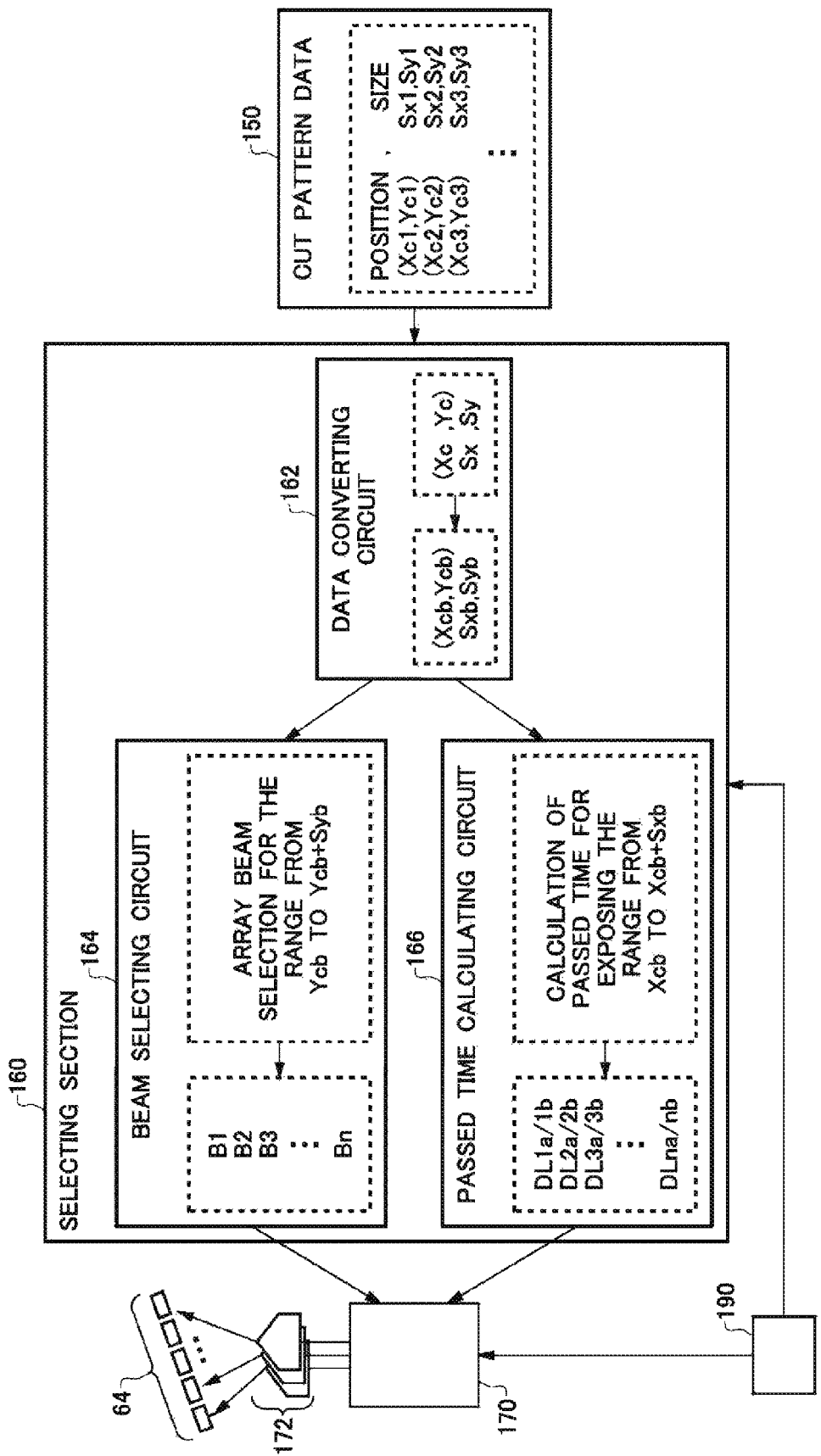
FIG. 6 shows an example of the selecting section 160 according to the present embodiment.

FIG. 6 shows an example of the selecting section 160 according to the present embodiment. The selecting section 160 includes a data converting circuit 162, a beam selecting circuit 164, and a passed time calculating circuit 166.

The data converting circuit 162 selects the cut pattern data from the storage section 150 and converts this cut pattern data into a coordinate system relating to the configuration of the line pattern on the sample 10. The data converting circuit 162 acquires (Xci, Yci), Sxi, Syi (i=1, 2, 3, etc.) as the cut pattern data from the storage section 150, for example, and converts this data into (Xcbi, Ycbi), Sxbi, Sybi (i=1, 2, 3, etc.) that is exposure data in a coordinate system on the sample 10. Here, the Y coordinate values Yci and Syi of the cut pattern data are values that are integer multiples of the grid width g, and therefore the values Ycbi and Sybi resulting from the conversion are also discrete values.

The data conversion performed by the data converting circuit 162 is intended to correct the rotational error caused when the sample 10 is loaded onto the stage section 110 and the deformation error of the sample 10 caused by the device manufacturing processes such as etching and film formation of the sample 10, for example. In other words, if the precision of the stage section 110, the precision of the manufacturing process, and the like are sufficiently high, this correction is a data conversion for correcting the distance error to be approximately 10 ppm or less and the angle error to be approximately 1 mrad or less.

For example, in a case where the pattern width Sxi, Syi is from tens to hundreds of nanometers, even if this data conversion is performed, the resulting change will be less than 0.1 nm. In other words, in this case, when the processing is performed to cut away 0.1 nm or less, the expressions Sxi=Sxbi and Syi=Sybi are established. Accordingly, when the rotational error and the deformation error occurring for the sample 10 are within a predetermined range, the selecting section 160 may omit the data conversion relating to Sxi and Syi performed by the data converting circuit 162.

The beam selecting circuit 164 selects the electron beams to be used based on the exposure data (Xcb, Ycb), Sxb, Syb. For example, in a case where the Y direction coordinates of the grid 400 shown in FIG. 5 are Yc1, Yc2, . . . , Yc8 from the −Y direction side, the beam selecting circuit 164 selects the electron beam B1 as the electron beam to be used for the exposure in the Y coordinate range from Yc1 to Yc2. Specifically, for the cut pattern positioned from the coordinate Ycb to the coordinate Ycb+Syb, the beam selecting circuit 164 selects the electron beams B1, B2, . . . , Bn to be used for the exposure to be the electron beams corresponding to these coordinates.

For each of the electron beams B1 to Bn selected by the beam selecting circuit 164, the passed time calculating circuit 166 detects the timing for switching the electron beam to the ON state or the OFF state. The passed time calculating circuit 166 detects this timing based on the X coordinate of the exposure data, and outputs the result as the passed time, for example. Here, the passed time is the time until each electron beam included in the array beam 500 is set to the ON state or the OFF state, with the time at which the array beam passed the reference position as the origin.

The scanning control section 190 scans with the array beam 500 in the +X direction or the −X direction, which is the longitudinal direction of the line pattern. In a case where the cut pattern data is expressed by the exposure data (Xcb, Ycb), Sxb, Syb and the scanning control section 190 scans with the array beam 500 in the +X direction, by causing an electron beam to be in the ON state at the time when the irradiation position of the electron beam corresponding to the X-axis coordinate reaches the position Xcb and causing the electron beam to be in the OFF state when the irradiation position reaches the position Xcb+Sxb, it is possible to perform exposure within the pattern region of the cut pattern with this electron beam. In other words, the passed time calculating circuit 166 detects the passed time to be the time from a timing when the array beam 500 has passed the first reference position on the −X side of the exposure range to a timing when the electron beam has been switched to the ON state and the OFF state.

On the other hand, when the scanning control section 190 scans with the array beam 500 in the −X direction, by causing an electron beam to be in the ON state at the time when the irradiation position of the electron beam corresponding to the X-axis coordinate reaches the position Xcb+Sxb and causing the electron beam to be in the OFF state when the irradiation position reaches the position Xcb, it is possible to perform exposure within the pattern region of the cut pattern with this electron beam. In this case, the passed time calculating circuit 166 detects the passed time to be the time from a timing when the array beam 500 has passed the second reference position on the +X side of the exposure range to the timing when the electron beam has been switched to the ON state and the OFF state.

When a plurality of reference positions are set within a frame, the passed time calculating circuit 166 may detect the passed time to be from the timing when the reference position most recently passed among the plurality of reference positions was passed to the timing when the electron beam is switched to the ON state and the OFF state. For example, the passed time calculating circuit 166 calculates the passed time according to the velocity at which the scanning control section 190 scans with the array beam 500 in the longitudinal direction of the line pattern. In this case, the scanning control section 190 preferably performs exposure while continuously moving the array beam 500 in the frame, and when performing scanning in the longitudinal direction of the line pattern, the scanning control section 190 may control the velocity V of the array beam 500 such that the velocity V changes smoothly and at least does not become zero.

When the scanning control section 190 scans with the array beam 500 in the +X direction, the first reference position has an X coordinate S, the pattern start position of the cut pattern for the exposure is Xcb, and the pattern width, i.e. the pattern width in the X-axis direction, is S×b, the passed time calculating circuit 166 can calculate the passed time (DLa) until the electron beam is set to the ON state using the expression shown below. The passed time calculating circuit 166 may receive information concerning the velocity V from the scanning control section 190.

DLa=(Xcb−S)/V            Expression 1

The passed time calculating circuit 166 can calculate the passed time (DLb) until the electron beam is set to the OFF state at the pattern end position Xcb+Sxb using the expression shown below.

DLb=(Xcb+Sxb−S)/V            Expression 2

For the electron beams B1, B2, . . . , Bn selected by the beam selecting circuit 164, the passed time calculating circuit 166 respectively calculates the passed times until the electron beams are set to the ON state to be DL1a, DL2a, . . . , DLna. Furthermore, the passed time calculating circuit 166 respectively calculates the passed times until the electron beams are set to the OFF state to be DL1b, DL2b, . . . , DLnb.

In this way, the beam selecting circuit 164 and the passed time calculating circuit 166 respectively perform the selection of the electron beams to be used for the exposure and the detection of the passed time, corresponding to the cut pattern for the exposure. The selecting section 160 supplies the irradiation control section 170 with the selection result of the beam selecting circuit 164 and the detection result of the passed time calculating circuit 166.

Next, the exposure control section 140 controls the radiation of the charged particle beams while scanning with the irradiation position of the array beam 500 (S350). Specifically, the scanning control section 190 scans with the irradiation position of the array beam 500 with a velocity V by moving the stage section 110, and supplies the irradiation control section 170 with the irradiation position of the array beam 500 based on the position detection result of the detecting section 114. The irradiation control section 170 supplies a control signal to the corresponding blanking electrode 64 of the blanking section 60 in order to control the radiation of a selected electron beam, according to the irradiation position of the array beam 500 and the passed time.

Figure 7:
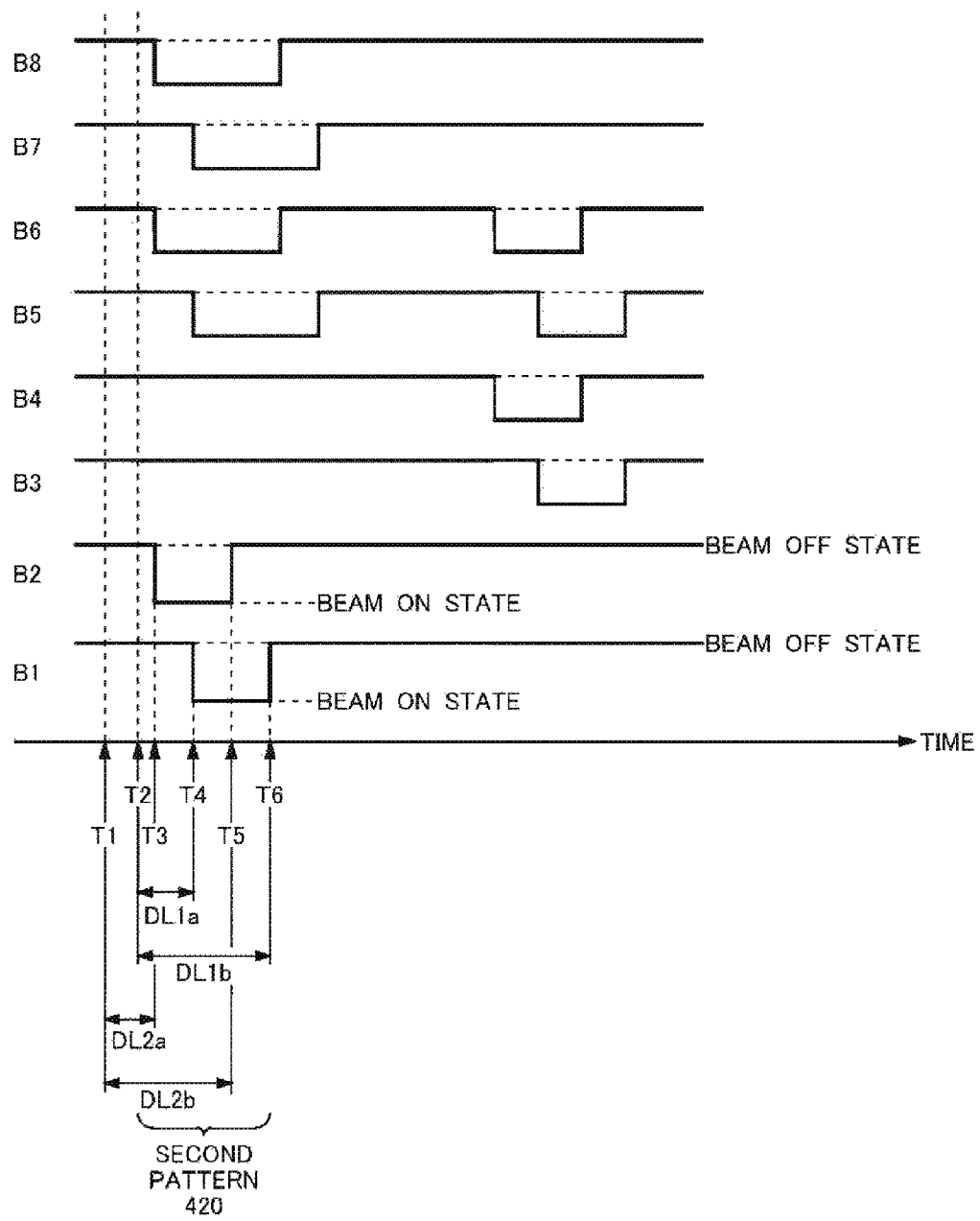
FIG. 7 is an exemplary timing chart for the control signals supplied to the blanking electrodes 64 by the irradiation control section 170 according to the present embodiment.

FIG. 7 is an exemplary timing chart for the control signals supplied to the blanking electrodes 64 by the irradiation control section 170 according to the present embodiment. Specifically, FIG. 7 shows the timing of the blanking operation for the electron beams B1 to B8 for exposure of the cut pattern in the exposure range shown in FIG. 5. In FIG. 7, the horizontal axis indicates time and the vertical axis indicates voltage.

The eight control signals shown in FIG. 7 are examples of the control signals supplied to the blanking electrodes 64 corresponding to the electron beams B1 to B8. Specifically, when the voltage level of a control signal is in a high state, the irradiation control section 170 supplies a signal voltage corresponding to this control signal to the blanking electrode 64, thereby causing the corresponding electron beam to be deflected and setting this electron beam to the OFF state. Furthermore, when the voltage level of a control signal is in a low state, the irradiation control section 170 does not supply a signal voltage to the blanking electrode 64, thereby causing the corresponding electron beam to be passed and setting this electron beam to the ON state.

On the time axis, the timing shown by T1 is the timing at which the second column including the electron beams B2, B4, B6, and B8 passes the first reference position. Furthermore, the timing shown by T2 is the timing at which the first column including the electron beams B1, B3, B5, and B7 passes the first reference position. Here, T2−T1=δ/V.

The signals shown by B1 and B2 in FIG. 7 are the control signals for exposure of the second pattern 420 of the cut pattern shown in FIG. 5 using the electron beams B1 and B2. The selecting section 160 selects the electron beams B1 and B2 based on the cut pattern data of the second pattern 420, and detects the passed time. FIG. 7 shows an example in which the irradiation control section 170 generates the control signals B1 and B2 according to the passed time.

The irradiation control section 170 switches the electron beam B1 from the OFF state to the ON state at the timing T4, which occurs when the passed time DL1a has passed from the timing T2 at which the irradiation position of the electron beam B1 passed the first reference position. The irradiation control section 170 switches the electron beam B1 from the ON state to the OFF state at the timing T6, which occurs when the passed time DL1b has passed from the timing T2.

The irradiation control section 170 switches the electron beam B2 from the OFF state to the ON state at the timing T3, which occurs when the passed time DL2a has passed from the timing T1 at which the irradiation position of the electron beam B2 passed the first reference position. The irradiation control section 170 switches the electron beam B2 from the ON state to the OFF state at the timing T5, which occurs when the passed time DL2b has passed from the timing T1.

In this way, the irradiation control section 170 can generate the control signals for controlling radiation of the electron beams according to the passed time and the selection result of the selecting section 160 and the position information of the irradiation position of the scanning performed by the scanning control section 190. By supplying the blanking electrodes 64 with the control signals generated by the irradiation control section 170, the column section 120 can expose the second pattern 420 of the cut pattern on the sample 10.

Similarly, the irradiation control section 170 generates the control signals of the electron beams B3 to B8 selected by the selecting section 160 to expose the first pattern 410 and the third pattern 430 on the sample 10. In the manner described above, the irradiation control section 170 according to the present embodiment controls the operation of switching the electron beams to the ON state and the OFF state based on the time that has passed from the timing at which the irradiation position passes a reference position. Therefore, there are cases where the length of the exposure range from the first reference position to the second reference position is defined according to the number of bits of a clock that counts the passed time.

The smallest period of this clock may be set according to a predetermined position resolution and stage velocity. For example, in a case where the data step of the exposure position is 0.125 nm, when the position resolution is set to a value of 0.0625 nm that is half of the data step and the maximum movement velocity of the stage is set to 50 mm/sec, the clock period is desired to have a minimum of 1.25 ns. Here, when the number of count bits of the clock counter is 12 bits (=4096), the count can be performed up to a passed time of approximately 5 µs. During this passed time, the stage moves 0.25 µm with the maximum movement velocity of 50 mm/sec.

In this way, the exposure apparatus 100 of the present embodiment can design the exposure range length in advance based on the clock period. By providing a plurality of reference positions and controlling the radiation of the electron beams based on the passed time from each reference position, the exposure apparatus 100 can expose a frame having an exposure range that is longer than the above exposure range.

Specifically, for all of the exposure ranges included in one frame, the exposure control section 140 scans with the irradiation position of the array beam 500 and controls the radiation of the electron beams based on the passed time from the reference position for each reference position that is passed. In other words, the exposure control section 140 performs exposure by controlling the plurality of electron beams while scanning with the irradiation position of the array beam 500 in the exposure range from the first reference position to the subsequent second reference position shown in the example of FIG. 5.

In a case where a further reference position is included in the frame, the exposure control section 140 continues exposing this frame (S360: No) and returns to step S340 for selecting the charged particle beams, in order to expose the next exposure range from the second reference position to the third reference position. The exposure control section 140 repeats the operations from S340 to S350 for this frame, until there are no more reference positions passed by the irradiation position of the array beam 500. While the scanning control section 190 is scanning the exposure range from the reference position most recently passed by the irradiation position of the array beam 500 to the subsequent reference position, the selecting section 160 may perform the detection of the passed time and the selection of the electron beams corresponding to a following exposure range that follows after the subsequent reference position. In this way, the exposure control section 140 can perform exposure of adjacent exposure ranges continuously over time.

In a case where there are no further reference positions in the frame (S360: Yes), the exposure control section 140 ends the exposure of this frame. In a case where there is a subsequent frame to be exposed (S370: No), the process returns to S320 and irradiation position of the array beam 500 is moved to the start point of the subsequent frame and exposure of this subsequent frame is performed. The exposure control section 140 repeats the operations from S320 to S360 until there are no more frames to be exposed. In a case where there are no more frames to be exposed (S370: Yes), the exposure control section 140 ends the exposure of this frame.

In the manner described above, the exposure apparatus 100 according to the present embodiment divides the possible irradiation region 200 of the array beam into frames and, for each frame, repeats the exposure operation of controlling the plurality of electron beams while scanning with the irradiation position of the array beam 500 in the longitudinal direction of the line pattern, thereby exposing the possible irradiation region 200. By moving the sample 10 with the stage section 110, the exposure apparatus 100 can form a plurality of different possible irradiation regions 200 on the surface of the sample 10, and can therefore perform exposure of the entire line pattern formed on the surface of the sample 10 with a single column section 120.

Figure 8:
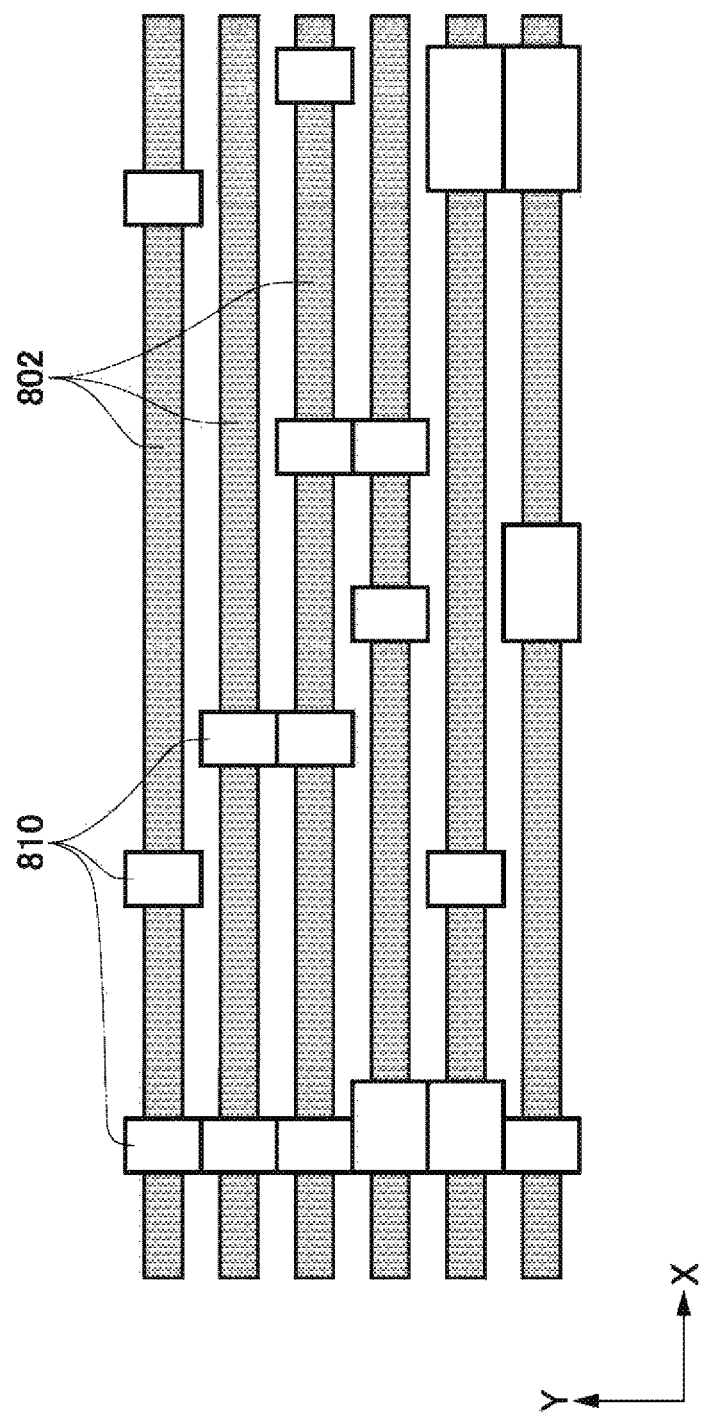
FIG. 8 shows an exemplary line pattern 802 formed on the surface of the sample 10.

FIG. 8 shows an exemplary line pattern 802 formed on the surface of the sample 10. The exposure apparatus 100 according to the present embodiment exposes the region displayed by the cut pattern 810 in the resist formed on the line pattern 802, by performing the operation described in FIG. 3. Through this exposure, the resist in the region of the cut pattern 810 can be removed, and therefore the line pattern 802 positioned at this cut pattern is exposed and the exposed line pattern 802 can be etched to form a fine wire pattern or the like.

Figure 9:
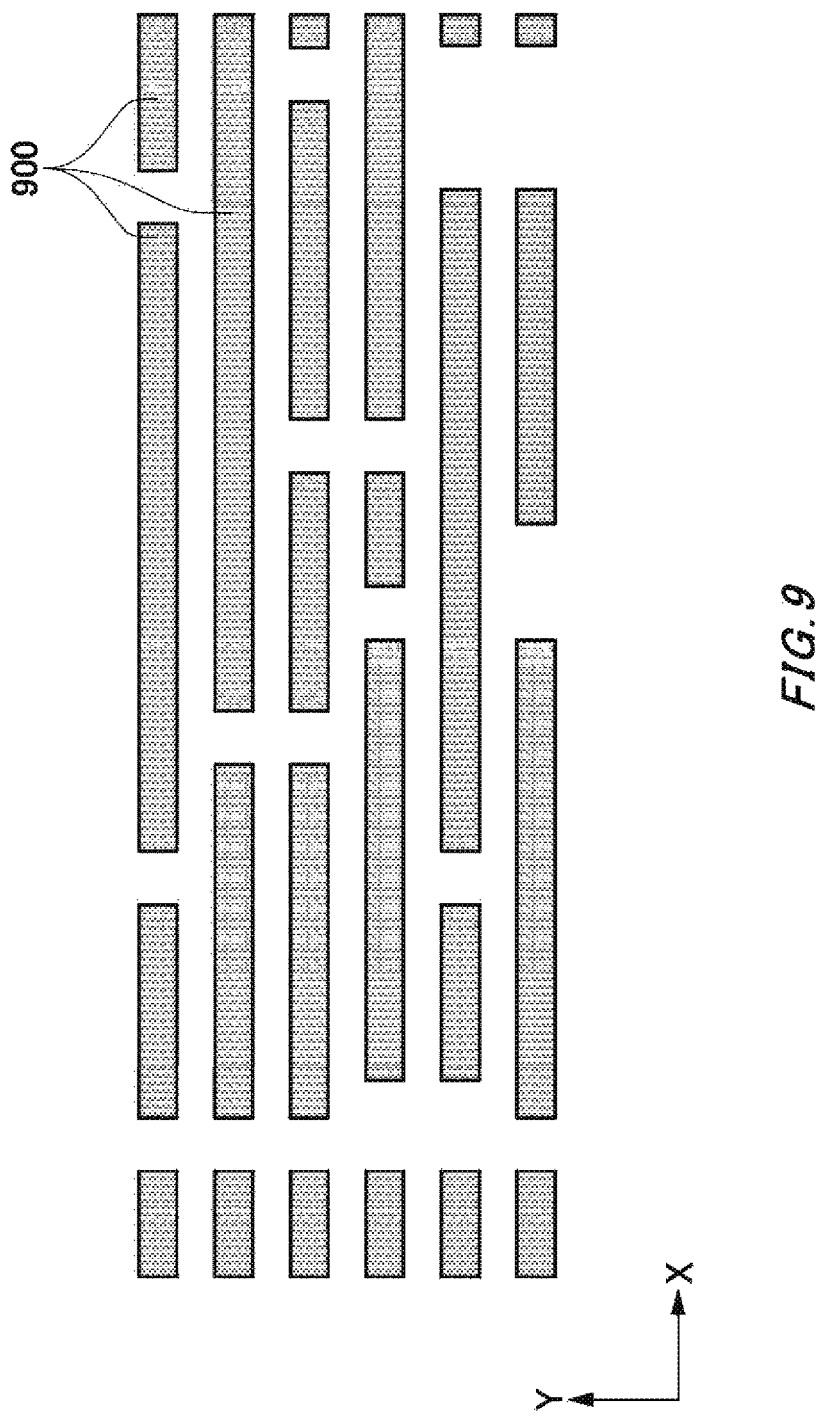
FIG. 9 shows an exemplary fine wire pattern 900 formed on the surface of the sample 10.

FIG. 9 shows an exemplary fine wire pattern 900 formed on the surface of the sample 10. With the exposure apparatus 100 according to the present embodiment, a finer wire pattern 900 can be formed by exposing the sample 10 on which the line pattern is formed in advance. For example, the line pattern 802 shown in FIG. 8 is a simple line and space pattern, and therefore it is possible to form the pattern with a line width and line interval of approximately 10 nm by using optical exposure technology. By using the exposure apparatus 100 according to the present embodiment that utilizes electron beams, this line pattern 802 can be machined, and therefore it is possible to form a fine wire pattern 900 that cannot be formed merely by optical exposure technology, such as a gate electrode. By using optical exposure technology to form the line pattern 802, it is possible to reduce the total machining time needed to form the fine wire pattern 900.

Furthermore, the coordinates of the cut pattern and the configuration of the irradiation position of the array beam 500 is based on the grid used for designing the line pattern 802, and therefore the exposure control section 140 can perform fine exposure with a simple control operation, without requiring complex feedback control. In the above description, the exposure apparatus 100 according to the present embodiment is described as an electron beam exposure apparatus that utilizes electron beams, but the present invention is not limited to this, and the present invention can be applied in the same manner to exposure apparatuses utilizing various types of charged particle beams. Furthermore, the present embodiment above describes an example of exposure of a cut pattern, but the present invention is not limited to this, and can be applied to the exposure of a via pattern in the same manner.

The exposure apparatus 100 according to the present embodiment describes an example of exposing the sample 10 on which is formed a line pattern having substantially the same line widths and the same line intervals. Instead, the exposure apparatus 100 may expose a sample 10 having formed thereon a line pattern with different line widths and line intervals. In a case where the line pattern is formed with different line widths and line intervals based on the grid, the exposure apparatus 100 can expose the line pattern at the designated irradiation position corresponding to this grid.

Figure 10:
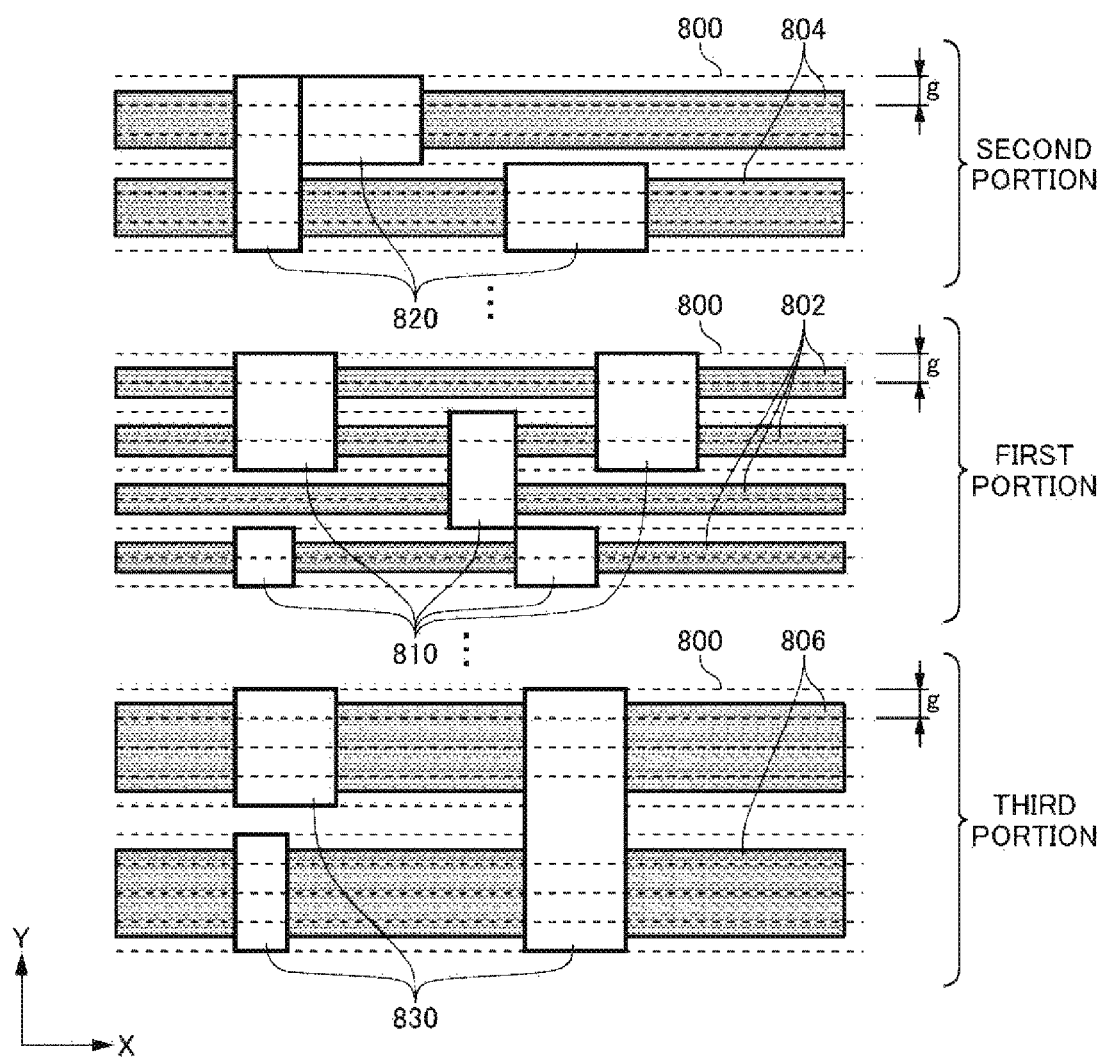
FIG. 10 shows an exemplary sample 10 on which is formed a line pattern having different line widths and different line intervals.

FIG. 10 shows an exemplary sample 10 on which are formed line patterns having different line widths and different line intervals. In this example, the sample 10 includes a first portion, and second portion, and a third portion, and the line patterns formed respectively in these portions have different line widths and different line intervals. In this way, even when a plurality of types of line patterns are formed on a single sample 10, each line pattern is designed using a common grid.

FIG. 10 shows an example in which the line pattern 802 of the first portion has a line width of g and a line interval of g, the line pattern 804 of the second portion has a line width of 2 g and a line interval of g, and the line pattern 806 of the third portion has a line width of 3 g and a line interval of 2 g.

In this way, when the widths and the intervals of the line patterns are different, the sizes of the cut patterns 810, 820, and 830 corresponding respectively to these line patterns are also different. However, in a case where each line pattern is designed based on the same grid 800, the Y coordinates of each cut pattern can be expressed as discrete coordinates on the grid 800, as described in FIGS. 4 and 5. In this case, the irradiation positions of the electron beams correspond to a grid with intervals of g, and therefore the exposure apparatus 100 according to the present embodiment can perform exposure for such cut patterns.

Figure 11:
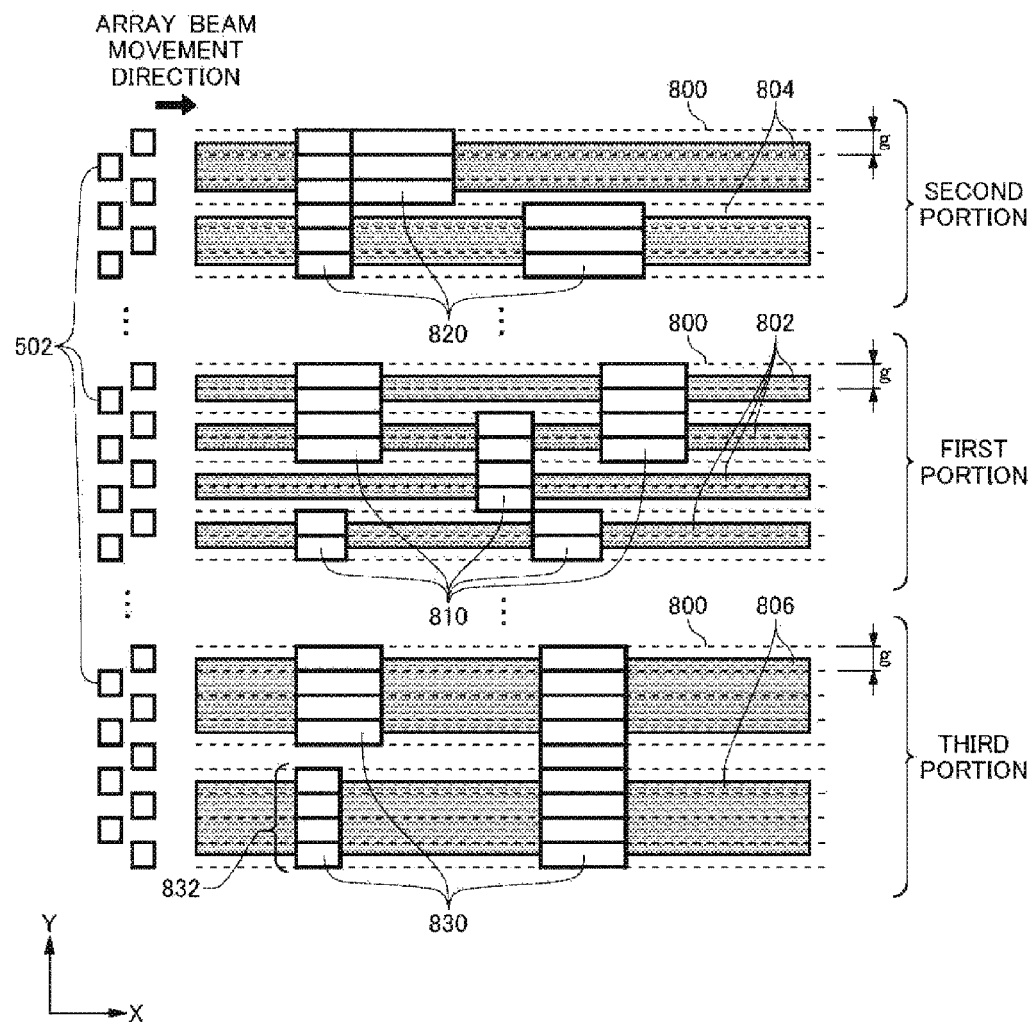
FIG. 11 shows an example in which the irradiation regions 502 of the electron beams according to the present embodiment are arranged in correspondence with the grid 800.

FIG. 11 shows an example in which the irradiation regions 502 of the electron beams according to the present embodiment are arranged in correspondence with the grid 800. Specifically, FIG. 11 shows an example in which the irradiation region of the electron beam Bn arranged as the n-th electron beam counting from the −Y direction side is arranged between the n-th and the (n+1)-th grid lines counting from the −Y direction side, as described in FIG. 5. As a result, when a cut pattern is positioned between the k-th and 1-th grid lines, for example, the exposure apparatus 100 can expose this cut pattern by using the k-th to (1-1)-th electron beams.

In other words, in this case, the selecting section 160 selects at least one charged particle beam that is continuous in the width direction from among the plurality of charged particle beams, according to the width of the line pattern at the designated irradiation position. For example, according to the line pattern 802 of the first portion with a line width of g, the selecting section 160 selects two electron beams lined up in the width direction in the array beam in order to expose the cut pattern with a pattern width of 2 g for cutting this line pattern 802.

As another example, according to the line pattern 804 of the second portion with a line width of 2 g, the selecting section 160 selects three electron beams lined up in the width direction in the array beam in order to expose the cut pattern with a pattern width of 3 g for cutting this line pattern 804. Similarly, according to the line pattern 806 of the third portion with a line width of 3 g, the selecting section 160 selects four electron beams lined up in the width direction in the array beam in order to expose the cut pattern with a pattern width of 4 g for cutting this line pattern 806. In this way, the selecting section 160 selects m+1 electron beams according to the line width of m×g.

As described in FIGS. 6 and 7, the selecting section 160 detects each irradiation position by determining the passed times corresponding to the selected electron beams. In this way, by controlling the radiation of the electron beams while scanning with the irradiation position of the array beam 500, the exposure control section 140 can expose each of the cut patterns 810, 820, and 830. In the example of FIG. 11 as well, the exposure apparatus 100 may scan with the array beam having a beam width of n×g corresponding to the number n of the electron beams, and may expose the sample 10 in each frame having a frame width corresponding to the beam width of n×g. In this way, the exposure apparatus 100 according to the present embodiment can expose the corresponding cut pattern by selecting the suitable electron beams corresponding to the irradiation positions, even when line patterns with different line widths and different line intervals are formed on the sample 10.

The exposure apparatus 100 according to the present embodiment is an example in which the sample 10 is irradiated by the electron beams selected by the selecting section 160 in a region of the cut patterns corresponding to the passed time. In addition to this, the exposure apparatus 100 may adjust the control signals for radiating the electron beams to adjust the exposure amount within the region of the cut patterns. Specifically, in a case where at least one charged particle beam is used to irradiate a range with a designated length in the longitudinal direction of the line pattern, the irradiation control section 170 changes the radiation amount of the at least one charged particle beam according to the irradiation position within this range.

Figure 12:
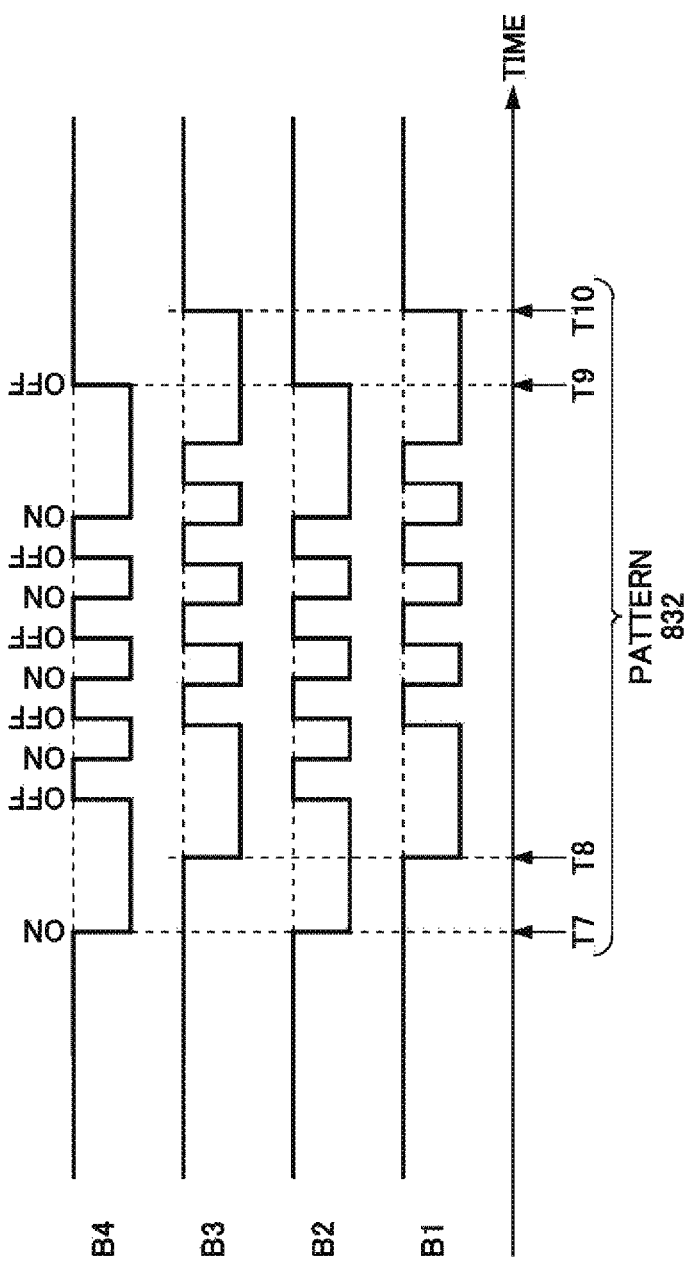
FIG. 12 shows examples of control signals for adjusting the exposure amount of a cut pattern generated by the irradiation control section 170 according to the present embodiment.

FIG. 12 shows examples of control signals for adjusting the exposure amount of a cut pattern generated by the irradiation control section 170 according to the present embodiment. In FIG. 12, the horizontal axis indicates time and the vertical axis indicates voltage, in the same manner as in FIG. 7. At the timing T7, the control signals B2 and B4 are switched form the high state to the low state in order to irradiate the sample 10 with the electron beams B2 and B4. Furthermore, at the timing T9, the control signals B2 and B4 are switched form the low state to the high state in order to stop the irradiation with the electron beams B2 and B4.

In the same manner, at the timing T8, the control signals B1 and B3 are switched form the high state to the low state in order to irradiate the sample 10 with the electron beams B1 and B3, and at the timing T10, the control signals B1 and B3 are switched form the low state to the high state in order stop the irradiation with the electron beams B1 and B3. Here, the time difference between the timing T7 and the timing T8 and the time difference between the timing T9 and the timing T10 are substantially equal to the time difference ($\delta/V$) corresponding to the interval $\delta$ between the columns of electron beams. As a result, the electron beams B1 to B4 begin being radiated at substantially the same coordinates on the X axis, and stop being radiated at substantially the same coordinates on the X axis. In other words, the electron beams B1 to B4 are driven in a manner to expose the cut pattern 832 shown in FIG. 11, for example.

In this way, when exposing a cut pattern using a plurality of electron beams, the tendency of the boundary between exposure region to become less clear and more blurred is more pronounced when the exposure surface area of the exposure regions are larger. Therefore, the exposure apparatus 100 of the present embodiment may decrease the exposure amount by adjusting the control signals for radiating the electron beams, to reduce the unclearness of the boundaries between exposure regions.

In a case where a region with a designated length in the longitudinal direction of the line pattern is irradiated by at least one charged particle beam, the irradiation control section 170 changes whether at least one charged particle beam irradiates the sample 10 according to the irradiation position within this exposure range. For example, during the period between the timing T7 and the timing T9 when the sample 10 is being exposed and irradiated by the electron beams B2 and B4, the irradiation control section 170 repeatedly stops and starts the radiation of the electron beams B2 and B4. In the same manner, during the period between the timing T8 and the timing T10 when the sample 10 is being exposed and irradiated by the electron beams B1 and B3, the irradiation control section 170 repeatedly stops and starts the radiation of the electron beams B1 and B3.

In this way, the irradiation control section 170 can adjust the exposure amount of the entire exposure region by providing a period during which the radiation of the electron beams is stopped within the period during which the exposure is performed by radiating the electron beams. Here, the irradiation control section 170 may shift the timing at which the sample 10 is irradiated by two charged particle beams having the closest paths, from among the plurality of charged particle beams. For example, during a period when exposure is performed, the irradiation control section 170 performs control such that the period during which the radiation of the electron beam B1 is stopped and the period during which the radiation of the electron beam B2 is stopped do not temporally overlap. In this way, the irradiation control section 170 can disperse the positions that are not irradiated by electron beams within the exposure region, thereby stopping localized skewing of the irradiation amount of the electron beams.

Figure 13:
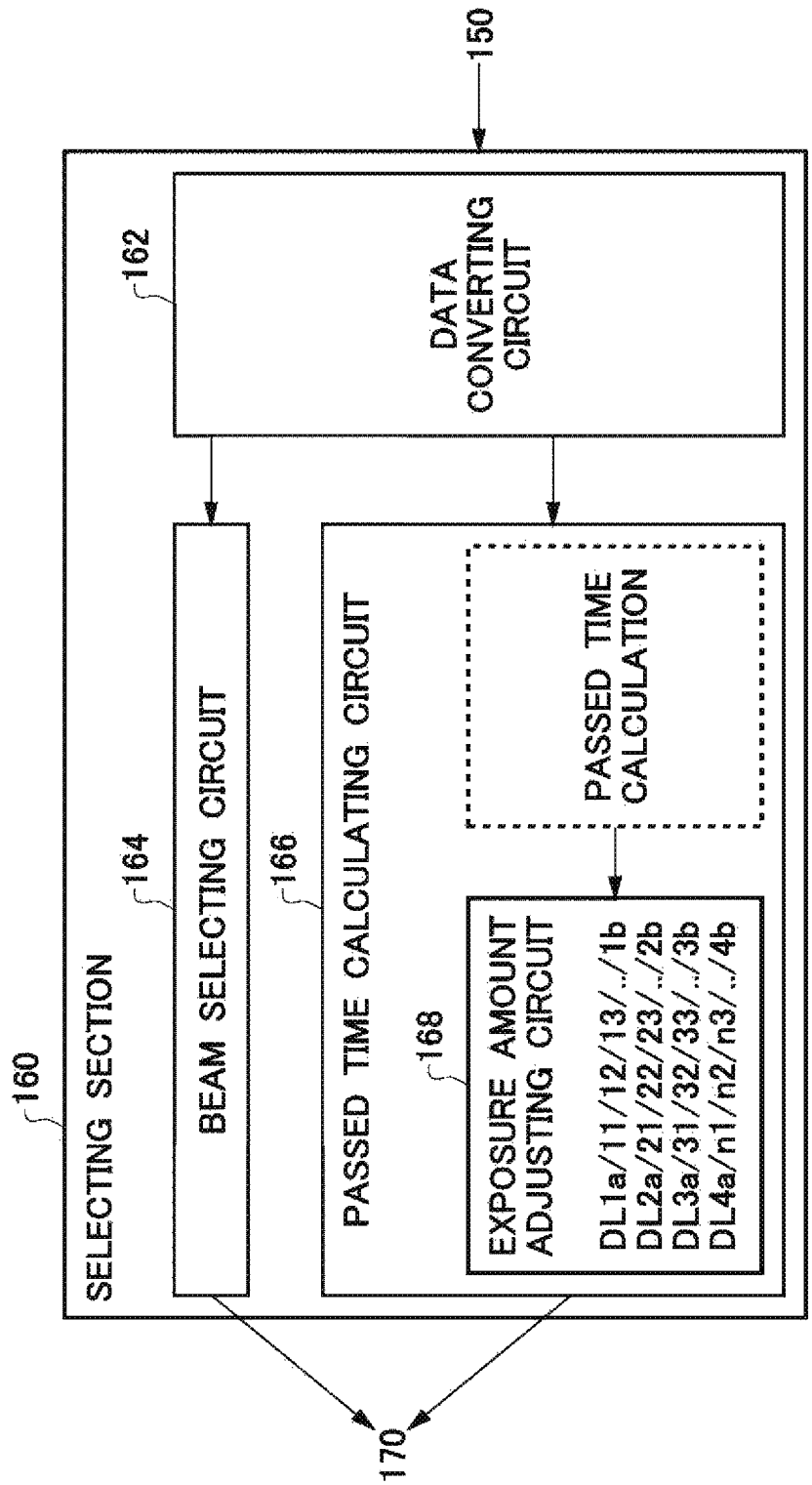
FIG. 13 shows an exemplary configuration of the selecting section 160 that performs the exposure amount control shown in the timing chart of FIG. 12.

FIG. 13 shows an exemplary configuration of the selecting section 160 that performs the exposure amount control shown in the timing chart of FIG. 12. In FIG. 13, components that have substantially the same operation as those of the selecting section 160 shown in the embodiment of FIG. 6 are given the same reference numerals and redundant descriptions are omitted. The passed time calculating circuit 166 shown in FIG. 13 further includes an exposure amount adjusting circuit 168 and, in addition to detecting the passed time in order to set the electron beams selected by the beam selecting circuit 164 to the ON state and the OFF state, calculates a passed time for controlling the exposure amount.

The passed time calculating circuit 166 calculates the passed times (DL1a, DL2a, DL3a, DL4a, DL1b, DL2b, DL3b, and DL4b) for setting the four electron beams B1, B2, B3, and B4 to the ON state and the OFF state, as shown in FIG. 12, for example, using Expression 1 and Expression 2. The exposure amount adjusting circuit 168 calculates the passed time for adjusting the exposure amount by further setting an electron beam to the OFF state and the ON state during the period from the passed time at which the electron beam is to be set to the ON state to the passed time at which the electron beam is to be set to the OFF state. With the passed times for adjusting the exposure amount set to be LD11, DL12, DL13, etc., the expressions shown below are fulfilled.

$$DL1a < DL11 < DL12 < DL13 < \ldots < DL1b$$

$$DL2a < DL21 < DL22 < DL23 < \ldots < DL2b$$

$$DL3a < DL31 < DL32 < DL33 < \ldots < DL3b$$

$$DL4a < DL41 < DL42 < DL43 < \ldots < DL4b \qquad \text{Expression 3}$$

The passed time for adjusting the exposure amount depends on the resist material and the like as well, and therefore the exposure apparatus 100 preferably observes in advance the state of the boundaries of the exposure regions relative to the exposure amounts, and stores conditions for suitable exposure amounts in the storage section 150 or the like. Instead, the user may use the CPU 130 to input parameters corresponding to passed times for adjusting the exposure amounts, for example. In this way, the passed time calculating circuit 166 can calculate the passed time for adjusting the state of the boundaries of the exposure regions.

The exposure apparatus 100 according to the present embodiment described above switches whether an electron beam is deflected by the blanking section 60 according to the voltage supplied to the corresponding blanking electrode 64. One example of the blanking section 60 having this function is described below using FIG. 14.

Figure 14:
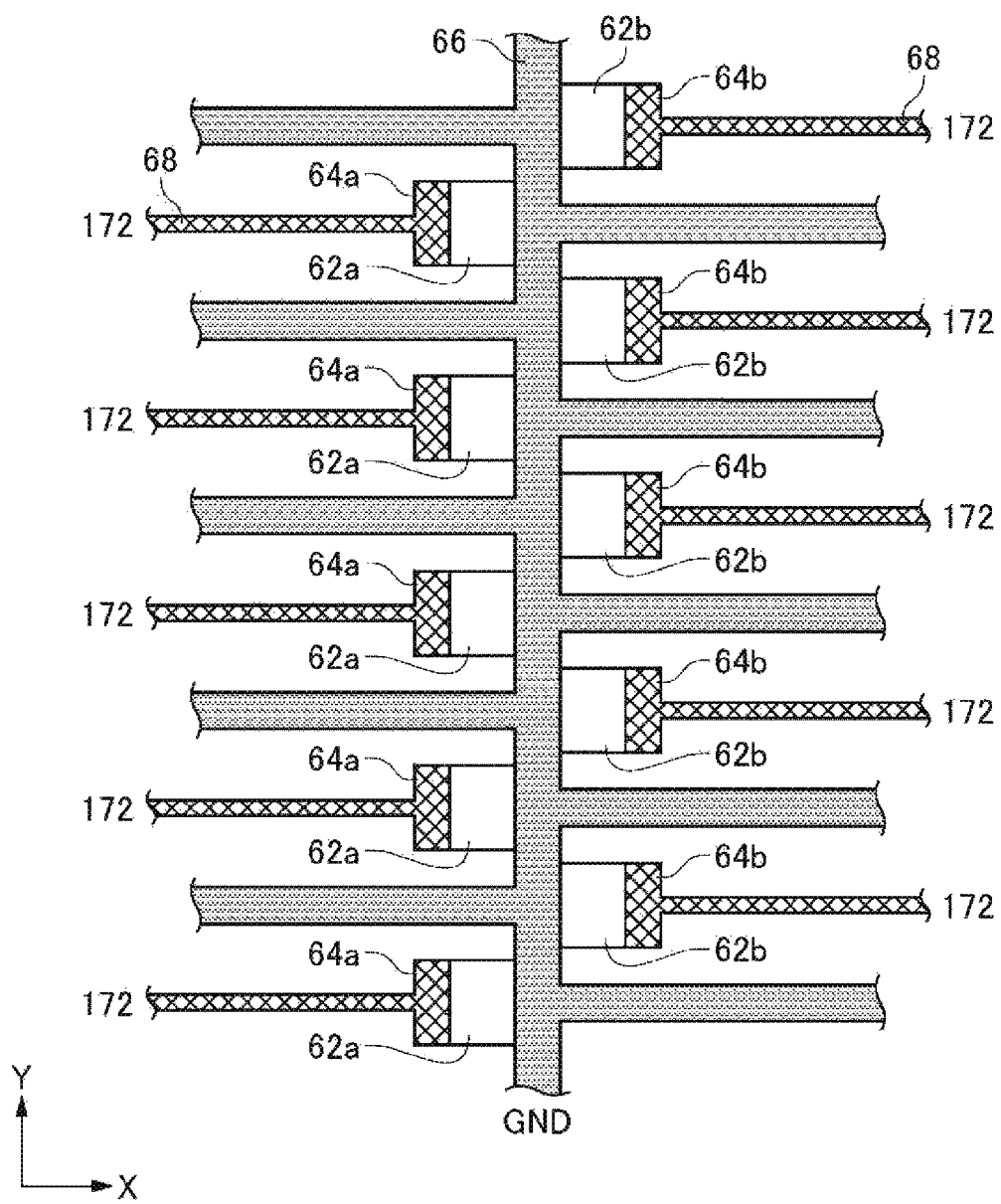
FIG. 14 shows an exemplary blanking section 60 according to the present embodiment.

FIG. 14 shows an exemplary blanking section 60 according to the present embodiment. The blanking section 60 includes a plurality of apertures 62, first blanking electrodes 64a, second blanking electrodes 64b, a common electrode 66, and electrode wires 68.

The apertures 62 each individually pass a corresponding one of the plurality of charged particle beams. The apertures 62 are preferably provided with a number of blanking sections 60 corresponding to the plurality of electron beams output as the array beam. In FIG. 14, the apertures 62 are divided into first apertures 62a and second apertures 62b in the X direction, which is a direction corresponding to the longitudinal direction of the line pattern. The first apertures 62a are a plurality of apertures 62 lined up in the Y direction, on the −X direction side, and are formed to correspond to the electron beams B1, B3, B5, and B7 shown in FIG. 5, for example. The second apertures 62b are a plurality of apertures 62 lined up in the Y direction, on the +X direction side, and are formed to correspond to the electron beams B2, B4, B6, and B8 shown in FIG. 5, for example.

Each first blanking electrode 64a is provided on the wall side of a first aperture 62a on the side opposite the common electrode 66. Each second blanking electrode 64b is provided on a wall surface of a second aperture 62b that is opposite the common electrode 66. The common electrode 66 is provided on a wall surface between the first apertures 62a and the second apertures 62b, in the X direction, and is an electrode shared by the first apertures 62a and the second apertures 62b. The common electrode 66 may be provided between each of the plurality of apertures 62 and the adjacent apertures 62 lined up in the Y direction.

Each electrode wiring 68 is connected to a first blanking electrode 64a and a second blanking electrode 64b, and to the irradiation control section 170 via a corresponding amplifier 172. The irradiation control section 170 changes the voltages of the first blanking electrodes 64a and the second blanking electrodes 64b according to the selection by the selecting section 160, to switch the electron beams to the ON state and the OFF state.

In the manner described above, the blanking section 60 includes a plurality of apertures 62 lined up in the Y direction in two columns, and therefore the Y-coordinate configuration of the apertures 62 can be arranged continuously while distancing the apertures 62 from each other with the common electrode 66. Therefore, the irradiation control section 170 can individually control each blanking electrode corresponding respectively to an aperture 62 by individually supplying voltage for switching the electron beam to the ON state and the OFF state to this blanking electrode. Furthermore, the plurality of electron beams passed by the plurality of apertures 62 can form an array beam in which the Y coordinates of the irradiation region are continuous. In other words, by scanning once with this array beam, it is possible to set the possible irradiation region of the array beam to be a frame in which the range of the electron beam irradiation is continuous along the Y coordinates extends in the X-axis direction that is the width of the frame.

The blanking section 60 according to the present embodiment described above includes a plurality of apertures 62 lined up in the Y direction in two columns, but instead, the blanking section 60 may include a plurality of apertures 62 lined up in the Y direction in three or more columns. In this case as well, the Y-coordinate configuration of the apertures 62 can be arranged continuously while distancing the apertures 62 from each other with the common electrode 66, and therefore the column section 120 can expose the surface of the sample 10 by scanning each frame with the array beam.

The exposure apparatus 100 according to the present embodiment described above is an example in which the irradiation with the charged particle beams is controlled while the scanning control section 190 moves the stage section 110 at a velocity V to scan the irradiation position of the array beam 500. Here, the stage section 110 preferably moves at a predetermined velocity V according to movement instructions of the scanning control section 190. However, the actual velocity and position of the stage section 110 includes an error relative to the target value specified by the instructed movement operation. For example, the position of the stage section 110 is affected by disturbing vibrations from the floor or peripheral section on which the apparatus is mounted, and it is possible that an unexpected fluctuation component is included. Furthermore, the position fluctuation can cause unexpected fluctuation in the movement velocity. Even if this movement error is measured and fed back to be used in movement control of the stage section 110, it is difficult to decrease this error to be less than or equal to a prescribed amount. The reason for this is that the stage section 110 has a constant inertial mass and friction resistance, and therefore it is impossible to completely feed back all of the components of the measured error.

In a case where the stage section 110 includes such a movement error, the irradiation position and the exposure amount of the array beam 500 fluctuates according to this movement error. Therefore, even when such a movement error of the stage section 110 occurs, the second configuration of the exposure apparatus 100 according to the present embodiment forms a complex fine pattern by decreasing the effect of this movement error.

Figure 15:
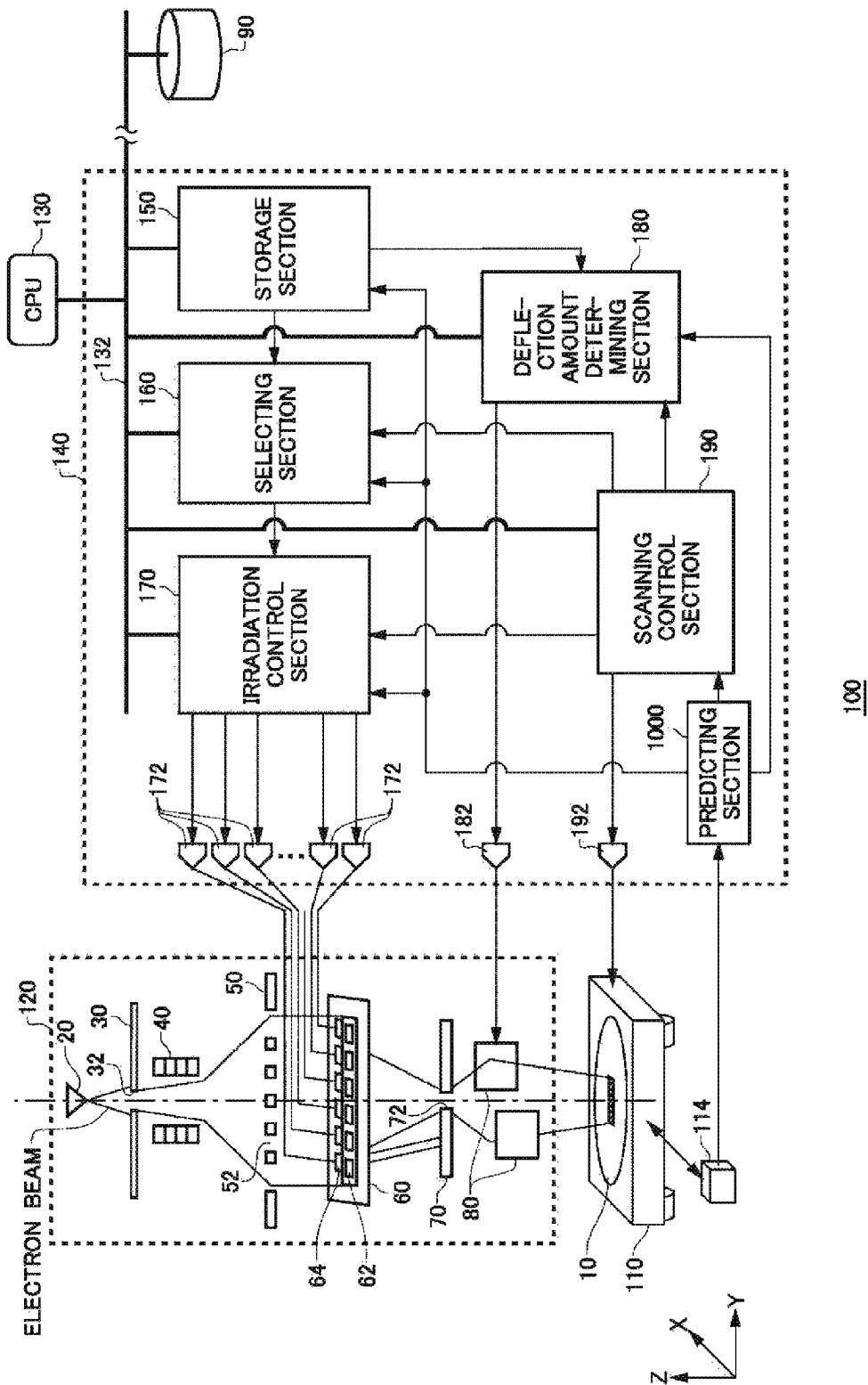
FIG. 15 shows a second exemplary configuration of an exposure apparatus 100 according to an embodiment of the present invention.

FIG. 15 shows a second exemplary configuration of the exposure apparatus 100 according to the present embodiment. In the exposure apparatus 100 according to the second exemplary configuration, components that have substantially the same function and configuration as those of the exposure apparatus 100 according to the embodiment shown in FIG. 1 are given the same reference numerals and redundant descriptions are omitted. The exposure control section 140 of the exposure apparatus 100 according to the second exemplary configuration further includes a predicting section 1000.

The predicting section 1000 is connected to the detecting section 114 and receives the detected position of the stage section 110 detected by the detecting section 114. The predicting section 1000 generates a predicted drive amount obtained by predicting the drive amount of the stage section 110 based on the detected position of the stage section 110. The drive amount predicted by the predicting section 1000 is a movement position of the stage section 110, i.e. the sample 10, for a time t, for example.

For example, when the scanning control section 190 is controlled to perform uniform linear movement of the stage section 110 at the velocity V, the predicting section 1000 generates the predicted drive amount to be a straight line V-t represented by a first-order function of the time t. The predicted drive amount that is predicted by the predicting section 1000 may be a curved line V-t according to the control of the stage section 110 performed by the scanning control section 190. The predicting section 1000 is connected to the scanning control section 190 and supplies the scanning control section 190 with the predicted position of the exposure apparatus 100 corresponding to the generated predicted drive amount.

The scanning control section 190 of the second exemplary configuration performs irradiation control to irradiate the sample 10 with the charged particle beams based on the predicted drive amount. For example, the scanning control section 190 sets the movement error of the stage section 110 to be the difference between the predicted position of the stage section 110 detected at a certain timing (e.g. the timing $t_1$) based on a predicted drive amount generated in the past (e.g. the timing $t_0$, where $t_0 < t_1$) and the detected position (at the timing $t_1$) of the stage section 110 that is actually detected. The scanning control section 190 supplies the deflection amount determining section 180 with this movement error or information based on this movement error, to correct the movement error by deflecting the charged particle beam.

As a result, the deflection amount determining section 180 can determine the deflection amount of the deflecting section 80 to correct the movement error of the stage section 110 occurring dynamically. In other words, the deflecting section 80 deflects the charged particle beams based on the difference between the detected position and the predicted position of the stage section 110 corresponding to the predicted drive amount. In this way, the exposure apparatus 100 according to the present embodiment can correct the movement error and the like occurring when the sample 10 moves relative to the charged particle beam, thereby decreasing the errors in the exposure amount and the exposure position of the charged particle beams.

The predicting section 1000 may generate a time frame signal that determines timing inside the exposure apparatus 100, based on the predicted position of the stage section 110 corresponding to the predicted drive amount. In this case, the predicting section 1000 may generate a time frame signal and supply the irradiation control section 170 with the time frame signal each time the predicted position reaches a predetermined boundary value. Furthermore, the scanning control section 190 may generate a time frame signal and supply the irradiation control section 170 with the time frame signal in response to the predicting section 1000 supplying the scanning control section 190 with the predicted drive amount. This boundary value may cause a time frame signal with a substantially constant period to be generated at substantially uniform intervals on the straight line V-t and in a case where the stage section 110 ideally moves uniformly and linearly on the straight line V-t, i.e. a case where the predicted drive amount is always a line that is substantially the same as the straight line V-t.

The irradiation control section 170 determines the irradiation timing of the charged particle beams within a time frame based on the time that has passed from the time frame signal received from the predicting section 1000. In this way, even when a movement error of the stage section 110 occurs, the predicting section 1000 generates a predicted drive amount that takes into consideration the error that has occurred and generates the time frame signal based on this predicted drive amount, and therefore, compared to a case where an external clock signal or the like is used, timing control of the beam irradiation corresponding to the actual movement error of the stage section 110 can be easily performed.

Figure 16:
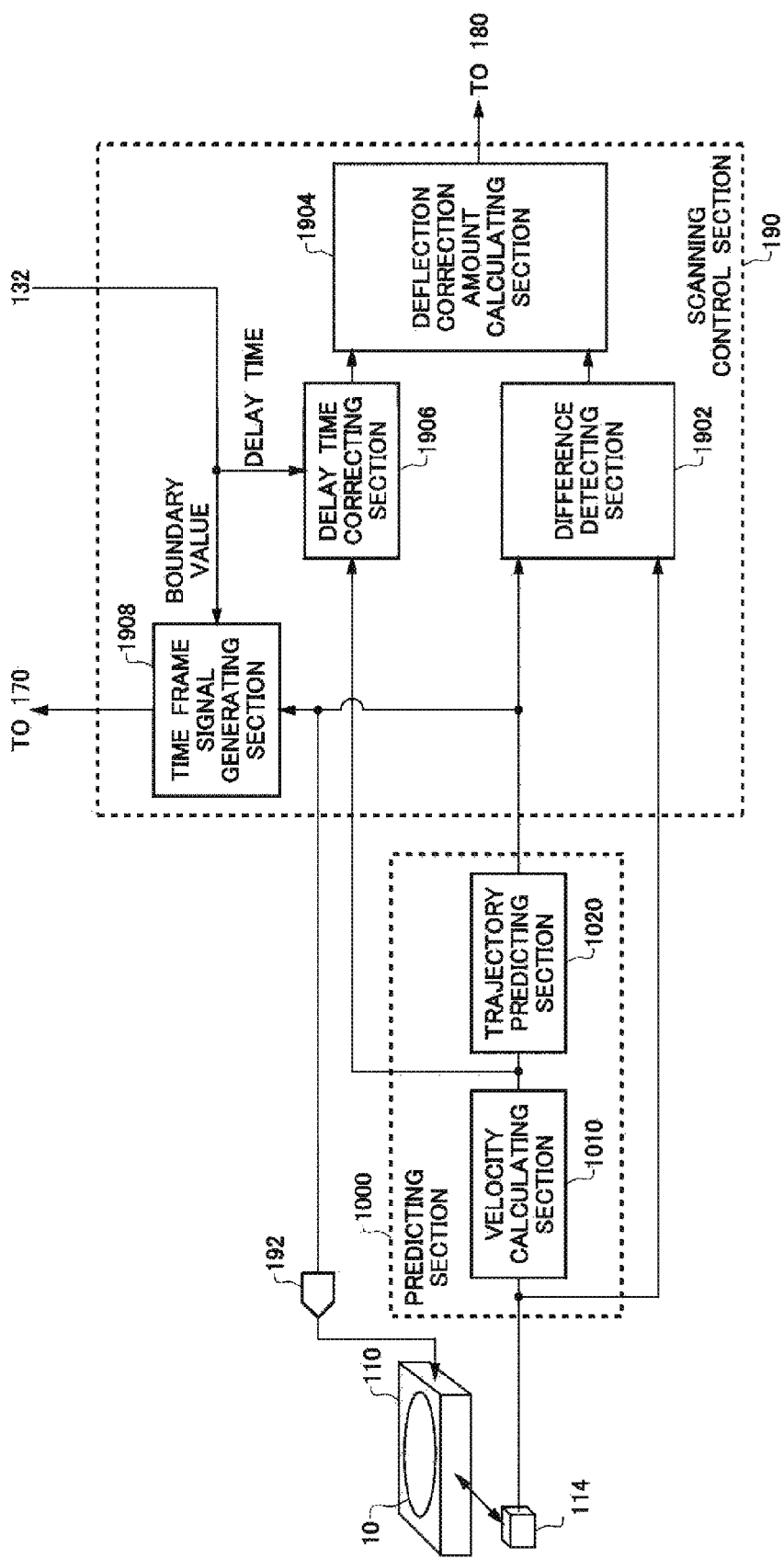
FIG. 16 shows examples of the predicting section 1000 and the scanning control section 190 in the second exemplary configuration.

FIG. 16 shows examples of the predicting section 1000 and the scanning control section 190 in the second exemplary configuration. In FIG. 16, components that have substantially the same function and configuration as those of the exposure apparatus 100 of the second exemplary configuration shown in FIG. 15 are given the same reference numerals and redundant descriptions are omitted.

The predicting section 1000 includes a velocity calculating section 1010 and a trajectory predicting section 1020. The velocity calculating section 1010 receives a plurality of detected positions of the stage section 110 detected by the detecting section 114, and calculates the velocity of the stage section 110 based on these detected positions.

The trajectory predicting section 1020 generates the predicted drive amount according to the velocity calculated by the velocity calculating section 1010. The trajectory predicting section 1020 uses the generated predicted drive amount to predict the trajectory path of the stage section 110, i.e. the position of the stage section 110 at a point in time after a predetermined time has passed, and supplies the predicted position of the stage section 110 to the scanning control section 190. The predicting section 1000 may also supply the scanning control section 190 with the velocity of the stage section 110 detected by the velocity calculating section 1010, in addition to the predicted position of the stage section 110.

The scanning control section 190 receives information concerning the velocity and predicted position of the stage section 110 from the predicting section 1000. In addition, the scanning control section 190 may receive the detected position of the stage section 110 detected by the detecting section 114. The scanning control section 190 includes a difference detecting section 1902, a deflection correction amount calculating section 1904, a delay time correcting section 1906, and a time frame signal generating section 1908.

The difference detecting section 1902 receives information concerning the predicted position and the detected position of the stage section 110, and calculates the position error of the stage section 110 according to the difference between the predicted position and the detected position. The difference detecting section 1902 supplies the deflection correction amount calculating section 1904 with the calculated position error of the stage section 110.

The deflection correction amount calculating section 1904 calculates the deflection amount of the charged particle beams for correcting the position error, according to the received position error of the stage section 110. The deflection correction amount calculating section 1904 supplies the deflection amount determining section 180 with information concerning the calculated deflection amount. In FIG. 16, the deflection correction amount calculating section 1904 is included in the scanning control section 190, but instead the deflection correction amount calculating section 1904 may be included in the deflection amount determining section 180.

The delay time correcting section 1906 calculates the correction amount for correcting the movement error occurring at the irradiation position of the charged particle beams by moving the stage section 110, while electrical signals and the like are being transmitted within the exposure apparatus 100. The delay time correcting section 1906 may receive information concerning a delay time occurring as a result of the transmission of electrical signals and the like, via the bus 132. The delay time correcting section 1906 receives information concerning the delay time from the external storage section 90, the CPU 130, or the storage section 150, for example. In FIG. 16, the delay time correcting section 1906 is included in the scanning control section 190, but instead the delay time correcting section 1906 may be included in the predicting section 1000.

The delay time correcting section 1906 supplies the deflection correction amount calculating section 1904 with information concerning the correction amount calculated according to the delay time. In this case, the deflection correction amount calculating section 1904 calculates the deflection amount of the charged particle beams obtained by combining the correction amount corresponding to the position error of the stage section 110 and the correction amount corresponding to the delay time, and supplies this deflection amount to the deflection amount determining section 180.

The time frame signal generating section 1908 generates the time frame signal. The time frame signal generating section 1908 may receive information concerning the predetermined boundary value, via the bus 132. For example, the time frame signal generating section 1908 may receive the information concerning the boundary value from the external storage section 90, the CPU 130, or the storage section 150. The time frame signal generating section 1908 receives the information concerning the predicted drive amount from the predicting section 1000 and generates the time frame signal every time the predicted position of the stage section 110 reaches the predetermined boundary value. The time frame signal generating section 1908 may supply the irradiation control section 170 and the like with the generated time frame signal. In FIG. 16, the time frame signal generating section 1908 is included in the scanning control section 190, but instead the time frame signal generating section 1908 may be included in the predicting section 1000.

Figure 17:
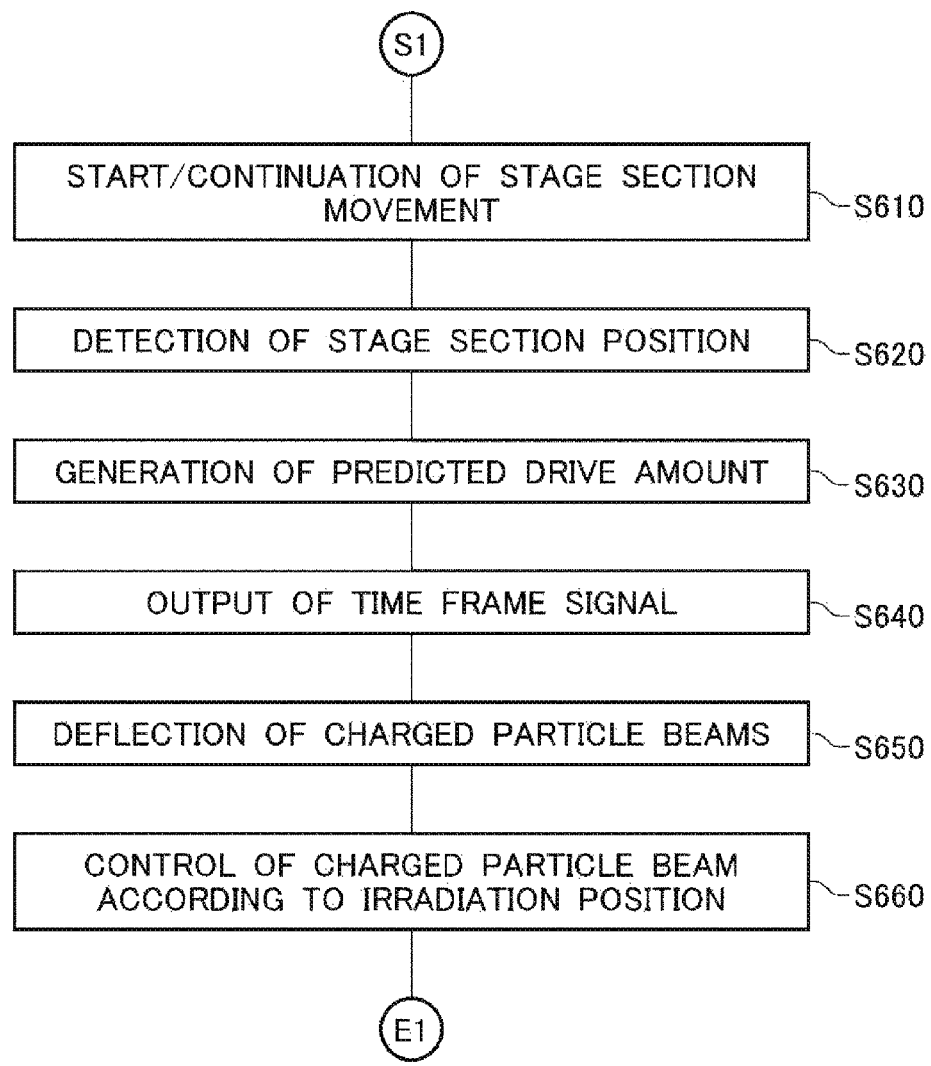
FIG. 17 shows a first example of a partial operational flow of the exposure apparatus 100 according to the present embodiment.

FIG. 17 is used to describe the operation of the exposure apparatus 100 having the second exemplary configuration explained above. FIG. 17 shows a first example of a portion of the operational flow of the exposure apparatus 100 according to the present embodiment. FIG. 17 is a portion of the process flow of the exposure apparatus 100, and shows an operation corresponding to step S350 for controlling the irradiation of the charged particle beams while scanning the irradiation position of the exposure apparatus 100 according to the embodiment shown in FIG. 3. In other words, the exposure apparatus 100 having the second exemplary configuration performs the operational flow from S1 to E1 shown in FIG. 17 to control the irradiation of the charged particle beams while scanning the irradiation position of the array beam 500.

The scanning control section 190 begins moving the stage section 110 at a predetermined initial velocity $V_0$ (S610). In other words, the scanning control section 190 scans the irradiation position of the array beam 500 at the velocity $V_0$.

Next, the detecting section 114 detects the position of the stage section 110 (S620). The detecting section 114 preferably detects the position of the stage section 110 a plurality of times at different timings. For example, the detecting section 114 calculates a first average position $X_{AVE1} = (\Sigma x^1_m)/M$ from the detected positions $x^1_m$ (m=1, 2, ..., M) at M detection timings $t_m$. For a timing immediately after the scanning control section 190 begins moving the stage section 110, the detecting section 114 again detects the average position of the stage section 110 after a time $T_p$ has passed. In other words, the detecting section 114 calculates a second average position $X_{AVE2}=(\Sigma x^2{}_m)/M$ from the detected positions $x^2{}_m$ (m=1, 2, ..., M) at M detection timings $T_p+t_m$. The detecting section 114 supplies the predicting section 1000 with the detection result.

Next, the predicting section 1000 generates the predicted drive amount (S630). The predicting section 1000 generates the predicted drive amount based on the plurality of detected positions of the stage section 110 at different timings received from the detecting section 114. For example, when the scanning control section 190 has begun moving the stage section 110, the predicting section 1000 generates the predicted drive amount based on the detected positions of the stage section 110 at two or more different timings. Furthermore, the predicting section 1000 may generate the predicted drive amount based on detected positions of the stage section 110 including detected positions of the stage section 110 received from the detecting section 114 in the past.

As an example, the velocity calculating section 1010 calculates the average movement velocity from the detected positions of the stage section 110, and the trajectory predicting section 1020 generates the predicted drive amount based on the average movement velocity of the stage section 110 and the time that has passed from when the detecting section 114 detected the position of the stage section 110. For example, the velocity calculating section 1010 uses the first average position $X_{AVE1}$, the second average position $X_{AVE2}$, and the time $T_p$ to calculate the average movement velocity $V_{AVE}=(X_{AVE2}-X_{AVE1})/T_p$. The trajectory predicting section 1020 generates the predicted drive amount to be the straight line $V_{AVE}$-t corresponding to the average movement velocity.

In this way, the velocity calculating section 1010 can calculate $V_{AVE} \times t$ to be the predicted movement distance of the stage section 110 when a time t has passed. For example, the predicting section 1000 calculates the predicted position $(V_{AVE} \times T_p)$ of the stage section 110 when a time $T_p$ has passed. The predicting section 1000 supplies the scanning control section 190 with the calculated predicted position.

The time frame signal generating section 1908 outputs the time frame signal according to the predicted drive amount (S640). The time frame signal generating section 1908 generates the time frame signal every time the predicted position of the stage section 110 passes a predetermined boundary value, according to the passage of time. For example, the time frame signal generating section 1908 generates the time frame signal in response to the predicted position of the stage section 110 passing boundary values arranged at intervals of distance L. In this case, the time frame signal generating section 1908 generates the time frame signal every time the expression $t=NL/V_{AVE}$ (N=1, 2, 3, ...) is satisfied. For example, the time frame signal generating section 1908 generates a square wave pulse signal and supplies this pulse signal to the irradiation control section 170 every time the predicted position of the stage section 110 moves 10 nm.

The scanning control section 190 treats the movement error of the stage as being zero when the predicting section 1000 generates the initial predicted drive amount. In other words, the deflection correction amount calculating section 1904 notifies the deflection amount determining section 180 that the movement error is zero. The deflection amount determining section 180 determines the deflection amount of the charged particle beams according to another error stored in advance in the storage section 150, for example, and the deflecting section 80 deflects the charged particle beams according to this deflection amount (S650).

The scanning control section 190 sets the second average value $X_{AVE2}$ as the position detection result of the detecting section 114, and supplies the irradiation control section 170 with the irradiation position of the array beam 500 based on this position detection result. In this way, the irradiation control section 170 controls the charged particle beams with the dynamic movement error of the stage being zero (S660).

Specifically, the irradiation control section 170 supplies a control signal to a blanking electrode 64 corresponding to a blanking section 60 in order to control the irradiation of a selected electron beam, according to the time that has passed and the irradiation position of the array beam 500. The control of the charged particle beams performed by the irradiation control section 170 has been described above, and is therefore omitted here. The irradiation control section 170 may use the time frame signal supplied from the time frame signal generating section 1908 as a clock signal that determines the operation timing.

The flow from S1 to E1 shown in FIG. 17 is an operation executed as S350 in the flow shown in FIG. 3, and therefore the exposure apparatus 100 repeats the selection of the charged particle beam (S340) and the flow from S1 to E1 until the exposure of the frame is finished (S360: Yes). In other words, after the selection of the charged particle beam, the scanning control section 190 continues moving the stage (S610).

The detecting section 114 detects the position of the stage section 110 at the time $(2T_p+t_m)$, which occurs after a further time $T_p$ has passed (S620). For example, the detecting section 114 sets the first average position $X_{AVE1}$ to be the second average position $X_{AVE2}$ that was previously calculated at the time $T_p+t_m$. Furthermore, the detecting section 114 sets the second average value $X_{AVE2}$ to be the average position calculated from the current detected position at the detection timing $2T_p+t_m$. The detecting section 114 supplies the predicting section 1000 with the detection results.

The velocity calculating section 1010 calculates the average movement velocity $V_{AVE}=(X_{AVE2}-X_{AVE1})/T_p$. The velocity calculating section 1010 sequentially calculates and updates the average movement velocity of the stage section 110. The trajectory predicting section 1020 generates the predicted drive amount to be the straight line $V_{AVE}$-t corresponding to the updated average movement velocity (S630). Furthermore, the time frame signal generating section 1908 outputs the time frame signal according to the updated predicted drive amount (S640). In this way, even when the stage section 110 experiences a movement error, it is possible to update the time frame signal to reflect this error and output the updated time frame signal. Accordingly, the irradiation control section 170 operates according to the time frame signal generated according to the movement of the stage section 110, and can therefore easily perform timing adjustment for the stage section 110. The time frame signal generating section 1908 may supply the time frame signal to each component in the exposure apparatus 100, in addition to the irradiation control section 170.

The difference detecting section 1902 sets the position detection result of the detecting section 114 to be the updated second average position $X_{AVE2}$, compares this position detection result to the prediction result of the predicting section 1000 obtained previously, and determines the movement error of the stage section 110 do be the difference therebetween $(V_{AVE}T_p-X_{AVE2})$. The deflection correction amount calculating section 1904 calculates the deflection amount corresponding to this movement error and notifies the deflection amount determining section 180 about the deflection amount. The trajectory predicting section 1020 uses the updated average movement velocity to calculate the predicted position ($V_{AVE} \times T_p$) of the stage section 110 at a time when an additional time $T_p$ has passed, and supplies the scanning control section 190 with this predicted position.

The deflection amount determining section 180 determines the deflection amount of the charged particle beams according to the total error obtained by adding together the movement error received from the scanning control section 190 and the other errors and the like stored in advance in the storage section 150. The deflecting section 80 deflects the charged particle beams according to this deflection amount (S650). In this way, the deflecting section 80 deflects the charged particle beams based on the difference between the detected position and the predicted position of the stage section 110 corresponding to the predicted drive amount, and therefore, even when the stage section 110 experiences a movement error, can deflect the charged particle beams in a manner to cancel out this movement error.

The deflecting section 80 may deflect the charged particle beams based on the difference between the predicted position and the detected position of the stage section 110 and on the movement position of the sample 10 corresponding to the predetermined delay time. More specifically, the timing at which the detecting section 114 detects the position of the stage section 110 experiences a delay time $T_d$ resulting from the transmission of electrical signals and the like until the deflecting section 80 deflects the charged particle beams to irradiate the sample 10. The stage section 110 also moves during this delay time $T_d$, and therefore there are cases where there is a movement error for the irradiation position of the charged particle beams.

Therefore, the delay time correcting section 1906 calculates the movement distance ($V_{AVE} \times T_d$) of the stage section 110 during the delay time $T_d$, and supplies the deflection correction amount calculating section 1904 with the calculated movement distance. The delay time $T_d$ can be determined in advance from the electrical length and the like of the circuit. As a result, the deflecting section 80 can deflect the charged particle beams based on the difference between the predicted position and the detected position of the stage section 110 while including the predetermined delay time $T_d$.

In the manner described above, the deflecting section 80 cancels out the movement error of the stage section 110 and irradiates the irradiation position on the sample 10 with the charged particle beams. Accordingly, the scanning control section 190 may set the position detection result of the detecting section 114 to be the second average position $X_{AVE2}$ and supply the irradiation control section 170 with the irradiation position of the array beam 500 based on this position detection result. In this way, even when the irradiation control section 170 controls the charged particle beams while the dynamic movement error of the stage section 110 is zero, i.e. in the same manner as when there is no dynamic movement error of the stage section 110, it is possible to irradiate the irradiation position on the sample 10 with the charged particle beams (S660). Furthermore, the time frame signal generating section 1908 generates the time frame signal according to the timing at which the predicted drive amount reaches a predetermined boundary position, in a state where the movement error of the stage section 110 is being fed back by the deflecting section 80. By controlling the irradiation timing according to this time frame signal, the irradiation control section 170 can control the irradiation timing of the charged particle beams in a state where the movement error of the stage section 110 relative to the charged particle beams has been decreased.

By repeating the operations of S340 and S1 to E1 described in FIGS. 3 and 17, the exposure apparatus 100 according to the present exposes a frame of the sample 10. In this way, the exposure apparatus 100 can expose the possible irradiation region 200 of the sample 10 while reducing the fluctuation of the irradiation position of the electron beams caused by movement error of the stage section 110.

In the manner described above, in the exposure apparatus 100 according to the present embodiment, the deflecting section 80 deflects the charged particle beams in a manner to decrease the movement error of the stage section 110. Instead of or in addition to this, the scanning control section 190 may perform feedback control of the stage section 110 in a manner to decrease this movement error of the stage section 110. The control of the stage section 110 includes physically moving the stage, and therefore there are cases where the control can be performed easily in a relatively low frequency band of up to hundreds of hertz. On the other hand, control in a relatively high frequency band that is greater than or equal to hundreds of hertz can be easily performed through electrical control to deflect the charged particle beams.

Therefore, the detecting section 114 may include a first filter that reduces the frequency component in the detection signal used to detect the position of the stage section 110 that is less than a predetermined frequency and a second filter that reduces the frequency component in this detection signal that is greater than or equal to the predetermined frequency, and may respectively output the high frequency component and low frequency component of this detection signal. Here, the first filter is a high-pass filter and the second filter is a low-pass filter, for example. Furthermore, the predetermined frequency may be set between hundreds of hertz and several kilohertz.

The predicting section 1000 supplies the scanning control section 190 with the predicted position of the stage section 110. The scanning control section 190 calculates the movement error, which is the difference between the predicted position and the detection result of the stage section 110, and supplies the deflection correction amount calculating section 1904 with this movement error and the output result of the first filter, which is the high frequency component of the detection signal of the stage section 110. In this way, the deflection correction amount calculating section 1904 can calculate the deflection amount based on a component obtained by reducing the frequency component that is less than the predetermined frequency in the difference between the predicted position and the detected position of the stage section 110, and the deflecting section 80 can deflect the charged particle beams according to this deflection amount.

Furthermore, the predicting section 1000 supplies the scanning control section 190 with the predicted position of the stage section 110. The scanning control section 190 calculates the target position of the stage section 110 that is designated in advance and the movement error, which is the difference between the detection result and the predicted position of the stage section 110, and controls the stage section 110 in a manner to reduce this movement error. In this way, the stage section 110 can adjust the movement of the sample 10 based on the detected position, which is based on the detection signal obtained by reducing the frequency component that is greater than or equal to the predetermined frequency in the detection signal obtained by detecting the position of the stage section 110.

In a case where the scanning control section 190 controls the stage section 110 to reduce the movement error, the movement velocity of the stage section causes fluctuation in the irradiation amount of the charged particle beams at the irradiation position on the sample 10. If this fluctuation in the irradiation amount of the charged particle beams is reduced relative to the intended irradiation amount at the irradiation position or is excessively larger than the intended irradiation amount, the exposure apparatus cannot operate well even when the movement error of the stage section 110 can be reduced.

Therefore, the exposure apparatus 100 of the present embodiment may control the stage section 110 of the scanning control section 190 and also control the blanking operation of the charged particle electron beams by the irradiation control section 170. Specifically, when the scanning control section 190 moves the stage section 110 at a velocity greater than or equal to a predetermined first velocity, the irradiation control section 170 may control the charged particle beams to irradiate the sample 10 for a longer time. When the scanning control section 190 moves the stage section 110 with a velocity that is less than or equal to a predetermined second velocity, the irradiation control section 170 may control the charged particle beams to irradiate the sample 10 for a shorter time.

In this case, the irradiation control section 170 receives from the scanning control section 190 a control signal used by the scanning control section 190 to control the stage section 110, and may identify the information relating to the velocity at which the stage section 110 is driven. Furthermore, the irradiation control section 170 may receive from the scanning control section 190 information relating to the movement error corresponding to the predicted position and the detection result of the stage section 110. In this way, the irradiation control section 170 may further control the charged particle beams to irradiate the sample 10, based on the component that is less than or equal to a predetermined frequency in the detection signal for detecting the position of the stage section 110.

Even when the scanning control section 190 does not control the movement velocity of the stage section 110, there are cases where the fluctuation in the movement velocity of the stage section causes fluctuation in the irradiation amount of the charged particle beams at the irradiation position on the sample 10. In this case, the irradiation control section 170 may control the irradiation amount of the charged particle beams based on the difference between the movement velocity of the stage section 110 and the predicted movement velocity of the stage section 110. The operational flow of an exposure apparatus 100 that performs such control is described using FIG. 18.

Figure 18:
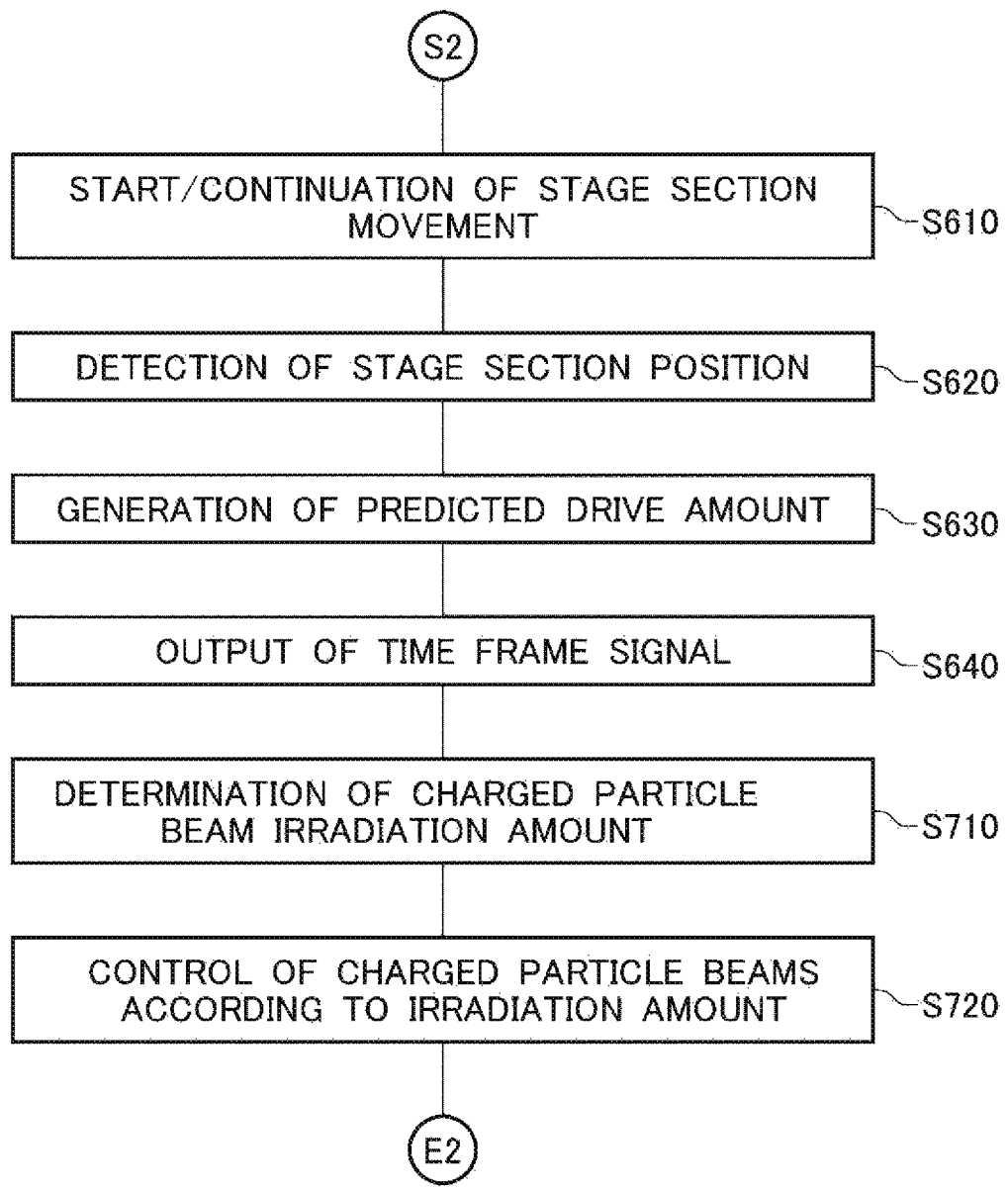
FIG. 18 shows a second example of a partial operational flow of the exposure apparatus 100 according to the present embodiment.

FIG. 18 shows a second example of a partial operational flow of the exposure apparatus 100 according to the present embodiment. FIG. 18 shows a portion of the operational flow of the exposure apparatus 100, and shows the operation corresponding to step S350 for controlling the irradiation of the charged particle beams while scanning the irradiation position of the exposure apparatus 100 according to the embodiment shown in FIG. 3. In other words, the exposure apparatus 100 having the second exemplary configuration performs the operational flow from S2 to E2 shown in FIG. 18 to control the irradiation of the charged particle beams while scanning the irradiation position of the array beam 500. In the operational flow of FIG. 18, components realizing substantially the same operation as in the operational flow of the exposure apparatus 100 according to the embodiment shown in FIG. 17 are given the same reference numerals and redundant descriptions are omitted.

The scanning control section 190 begins moving the stage section 110 at a predetermined initial velocity $V_0$ (S610). The scanning control section 190 determines the initial velocity $V_0$ of the stage section 110 in advance, based on the beam intensity of the charged particle beams and the intended irradiation amount at the irradiation position on the sample 10, e.g. an irradiation amount determined according to the resist material applied to the sample 10.

The beam intensity of the charged particle beams is approximately constant, aside from gradual changes over many years, and is difficult to adjust. Accordingly, when the irradiation of the charged particle beams continues and the stage section 110 is moved at a substantially constant movement velocity, the exposure amount distribution of the charged particle beams irradiating the sample 10 is an approximately constant distribution. When the irradiation control section 170 performs the blanking operation of the charged particle beams, it is possible to control the charged particle beams in a manner to reduce the exposure amount distribution, but it is impossible to increase this exposure amount distribution.

Therefore, the exposure apparatus 100 of the present embodiment performs suitable adjustment to increase and decrease the exposure amount distribution using the blanking operation, by adding a predetermined offset to the exposure amount distribution of the charged particle beams irradiating the sample 10. For example, the scanning control section 190 determines a target for the exposure amount distribution of the charged particle beams that enables the charged particle beams to realize a suitable irradiation amount at all of the irradiation positions on the sample 10, and determines the initial velocity $V_o$ of the stage section 110 to draw near this target exposure amount distribution by increasing and decreasing the exposure amount distribution of the charged particle beams. Specifically, when the stage section 110 is moving the sample 10 at a constant movement velocity and the sample 10 continues to be irradiated with the charged particle beams, the scanning control section 190 determines the initial value $V_o$ of the movement velocity of the stage section 110 such that the exposure amount distribution of the charged particle beams exceeds the predetermined target for the exposure amount distribution, e.g. a magnitude such as a maximum value, average value, or minimum value of the exposure amount.

In this way, the scanning control section 190 determines the initial value $V_0$ in a manner to enable the exposure amount distribution to reach the target, by having the irradiation control section 170 perform a blanking operation to at least a certain degree. Accordingly, the irradiation control section 170 controls the time that the sample 10 is irradiated by the charged particle beams such that the exposure amount distribution draws near the predetermined target for the exposure amount distribution, and can increase and decrease the exposure distribution amount of the charged particle beams to cause the exposure amount distribution to draw near this exposure amount distribution target.

Next, the detecting section 114 detects the position of the stage section 110 (S620), and the predicting section 1000 generates the predicted drive amount (S630). The predicting section 1000 calculates the average movement velocity from a plurality of detected positions of the stage section 110. The time frame signal generating section 1908 outputs the time frame signal (S640). The process until the time frame signal generating section 1908 outputs the time frame signal has already been described above, and is therefore not described here. The predicting section 1000 supplies the irradiation control section 170 with the calculated average movement velocity.

Next, the irradiation control section 170 determines the irradiation amount of the charged particle beams based on the difference between the movement velocity of the stage section 110 and the predicted movement velocity of the stage section 110 (S710). Here, the irradiation control section 170 sets the movement velocity to be the average movement velocity of the stage section 110 currently calculated by the predicting section 1000, sets the predicted movement velocity to be the average movement velocity of the stage section 110 calculated previously, and determines the irradiation amount of the charged particle beams. In this way, the irradiation control section 170 determines the irradiation amount of the charged particle beams according to changes in the average movement velocities calculated at different timings.

For example, if the change between the average movement velocity calculated at the timing T and the average movement velocity calculated at the timing $T+T_p$ is less than a predetermined change amount, the irradiation control section 170 sets the irradiation amount of the charged particle beams to be substantially constant. If the change between these average movement velocities is an increase greater than or equal to a predetermined change amount, the irradiation control section 170 increases the irradiation time of the charged particle beams according to this increase amount. Furthermore, if the change between these average movement velocities is a decrease greater than or equal to a predetermined change amount, the irradiation control section 170 decreases the irradiation time of the charged particle beams according to this decrease amount.

The irradiation control section 170 controls the irradiation of the charged particle beams according to the determined irradiation amount, and irradiates the irradiation position of the sample 10 with the charged particle beams (S720). In this way, by switching whether the sample 10 is irradiated by the charged particle beams according to the determined irradiation amount, the irradiation control section 170 controls the exposure amount distribution of the charged particle beams to draw near the predetermined target for the exposure amount distribution. Accordingly, even when the stage section 110 experiences a velocity fluctuation, the exposure apparatus 100 can adjust the blanking operation of the irradiation control section 170 according to this velocity fluctuation, and can therefor irradiate the sample 10 with the charged particle beams with a suitable exposure amount distribution.

The above describes control of the deflection by the deflecting section 80 and control of the blanking operation of the irradiation control section 170 as examples in which the exposure apparatus 100 according to the present embodiment controls the irradiation of the sample 10 with the charged particle beams based on the predicted drive amount generated by the predicting section 1000. The exposure apparatus 100 may also perform these two types of control in combination. The operational flow of an exposure apparatus 100 performing such control is described using FIG. 19.

Figure 19:
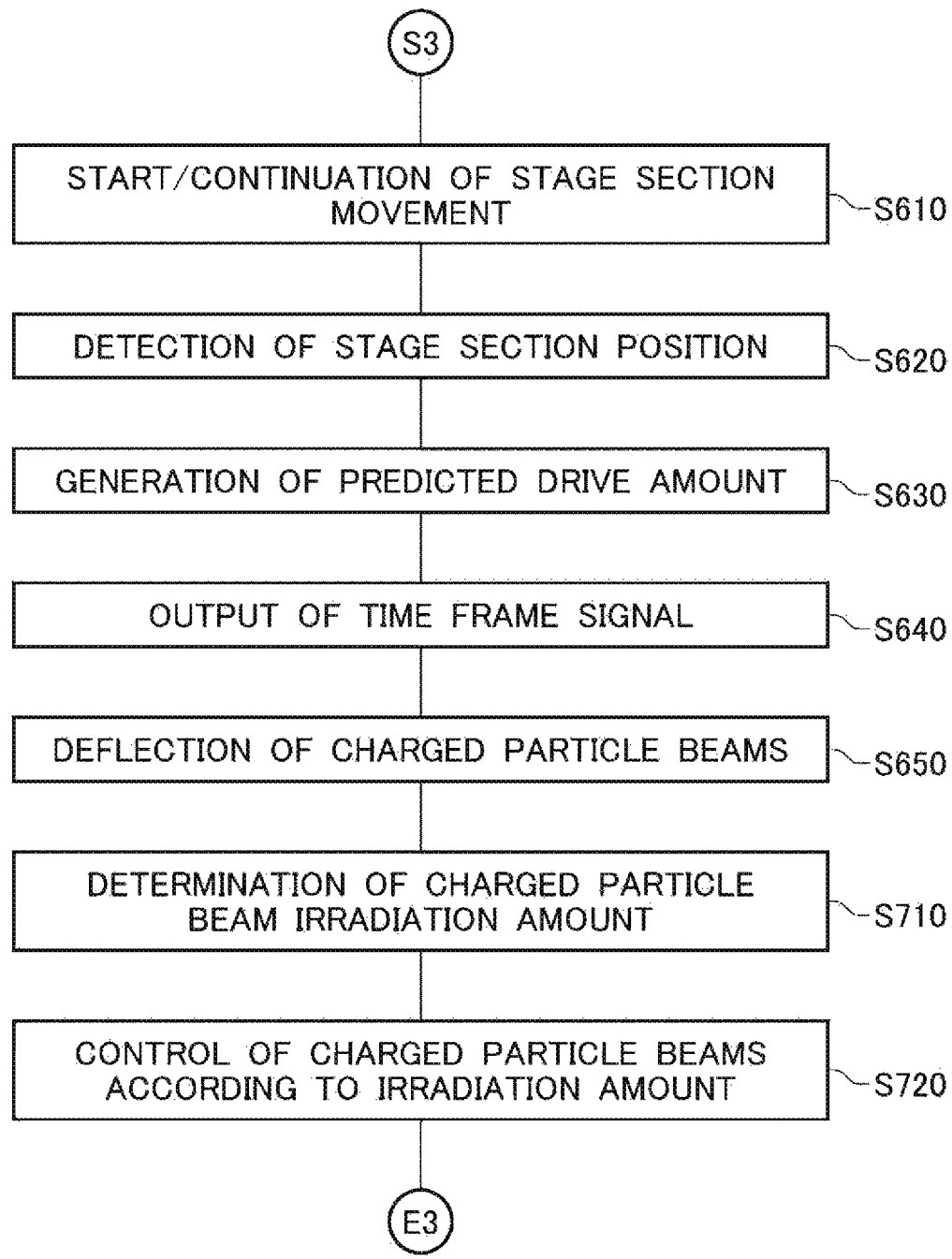
FIG. 19 shows a third example of a partial operational flow of the exposure apparatus 100 according to the present embodiment.

FIG. 19 shows a third example of a partial operational flow of the exposure apparatus 100 according to the present embodiment. FIG. 19 shows a portion of the operational flow of the exposure apparatus 100, and shows the operation corresponding to step S350 for controlling the irradiation of the charged particle beams while scanning the irradiation position of the exposure apparatus 100 according to the embodiment shown in FIG. 3. In other words, the exposure apparatus 100 having the second exemplary configuration performs the operational flow from S3 to E3 shown in FIG. 19 to control the irradiation of the charged particle beams while scanning the irradiation position of the array beam 500. In the operational flow of FIG. 19, components realizing substantially the same operation as in the operational flows of the exposure apparatus 100 according to the embodiment shown in FIGS. 17 and 18 are given the same reference numerals and redundant descriptions are omitted.

The scanning control section 190 begins moving the stage section 110 at a predetermined initial velocity $V_0$ (S610). As described in FIG. 18, the scanning control section 190 determines the initial velocity $V_0$ of the stage section 110 in advance, based on the beam intensity of the charged particle beams and the intended irradiation amount at the irradiation position on the sample 10. Next, the detecting section 114 detects the position of the stage section 110 (S620), and the predicting section 1000 generates the predicted drive amount (S630). The difference detecting section 1902 calculates the movement error of the stage section 110 based on the predicted drive amount. The time frame signal generating section 1908 outputs the time frame signal (S640).

Next, the deflecting section 80 deflects the charged particle beams based on the movement error of the stage section 110 calculated by the difference detecting section 1902 (S650). The irradiation control section 170 determines the irradiation amount of the charged particle beams based on the difference between the movement velocity of the stage section 110 and the predicted movement velocity of the stage section 110 (S710). The irradiation control section 170 controls the irradiation of the charged particle beams according to the determined irradiation amount, and irradiates the irradiation position on the sample 10 with the charged particle beams (S720).

In the manner described above, the operational flow from S3 to E3 shown in FIG. 19 is a combination of the operation described in FIGS. 17 and 18. By performing the operational flow shown in FIG. 19 as S350 in the operational flow shown in FIG. 3, even when the stage section 110 experiences a movement error, it is possible to increase and decrease the exposure amount distribution of the charged particle beams to draw near the target exposure amount distribution, while deflecting the charged particle beams in a manner to cancel out this movement error.

The exposure apparatus 100 according to the present invention described above is a single-column type of electron beam exposure apparatus that includes one column section 120, but the present invention is not limited to this, and the exposure apparatus 100 may include a plurality of column sections 120. An exposure apparatus 100 including a plurality of the column sections 120 is described below using FIG. 20.

Figure 20:
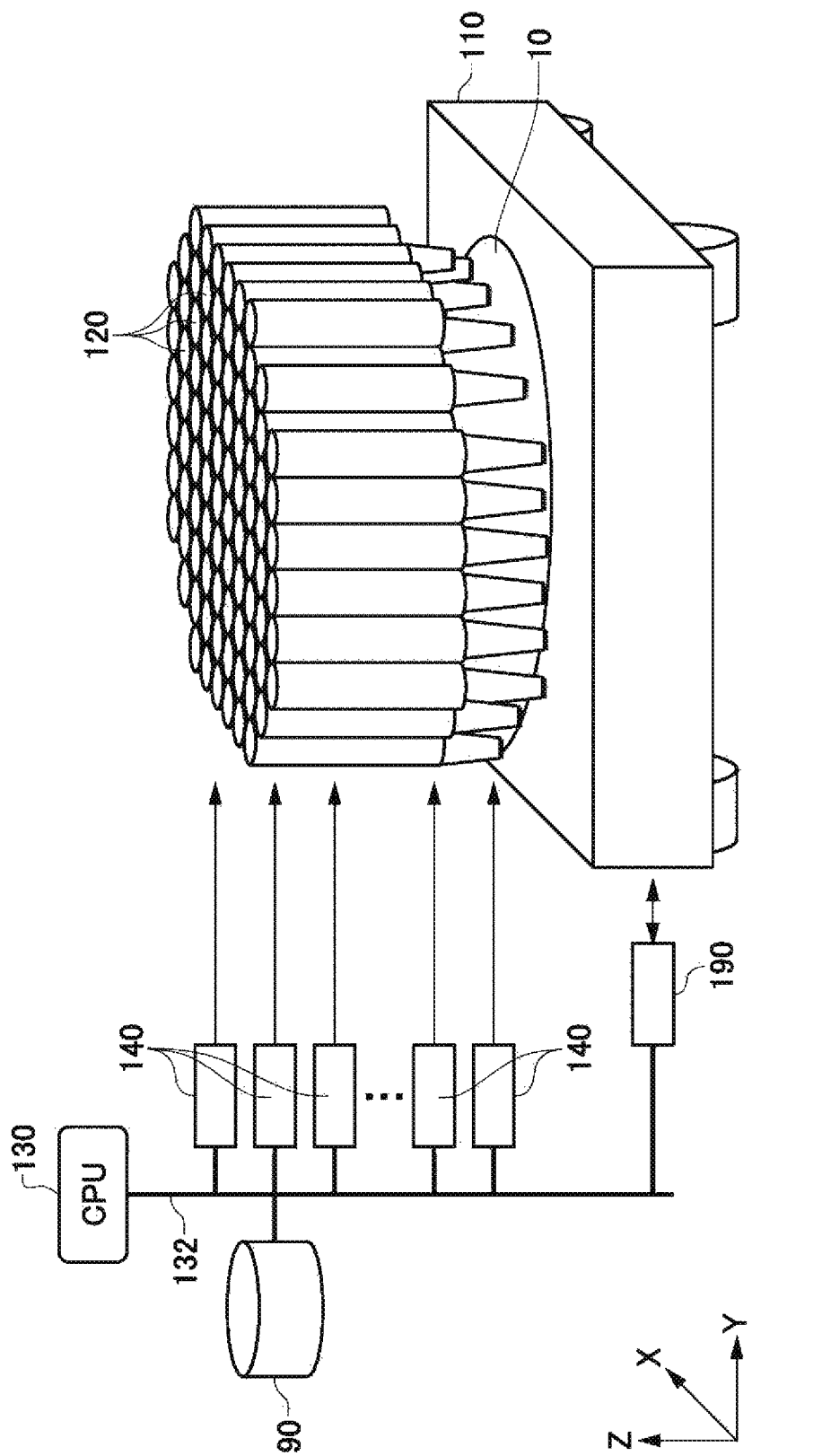
FIG. 20 shows a modification of the exposure apparatus 100 according to the present embodiment.

FIG. 20 shows a modification of the exposure apparatus 100 according to the present embodiment. In FIG. 20, components having substantially the same function as components of the exposure apparatus 100 according to the embodiment shown in FIG. 1 are given the same reference numerals, and redundant descriptions are omitted. The exposure apparatus 100 of the present modification includes a plurality of column sections 120 and a plurality of exposure control sections 140 that each include a selecting section 160, an irradiation control section 170, and a deflection amount determining section 180.

In the exposure apparatus 100 according to the present modification, in a case where the stage section 110 is moved to perform scanning with the irradiation position of the array beam, it is not necessary for each exposure control section 140 to include the scanning control section 190. FIG. 20 shows an example including one stage section 110, a plurality of column sections 120 of the exposure apparatus 100, one CPU 130, a plurality of exposure control sections 140 that do not include the scanning control section 190, and one scanning control section 190.

Each column section 120 is connected to a corresponding exposure control section 140 and exposes the sample 10. The operation of each column section 120 includes exposing the possible irradiation region 200 in each frame, in the manner described in FIG. 3 and the like. The scanning control section 190 controls the stage section 110 to move the sample 10 mounted thereon relative to the plurality of column sections 120, and irradiates the sample 10 with charged particle beams in parallel from the plurality of column sections 120.

In this way, the electron beam exposure apparatus 100 of the present modification can perform the exposure in parallel with a plurality of column sections 120, and can therefore significantly improve the throughput of the exposure. Furthermore, even when the sample 10 is semiconductor wafer or the like with a large radius exceeding 300 mm, it is possible to prevent a significant decrease in the throughput by increasing the number of column sections 120 in accordance with the radius.

With the exposure apparatus 100 of the present modification, there are cases where the intensities of the plurality of array beams output by the plurality of column sections 120 differ. Therefore, before performing the exposure, the exposure apparatus 100 may measure in advance the intensities of the array beams output respectively from the column sections 120. Furthermore, the exposure apparatus 100 may correct the passed time for each exposure control section 140, such that there is no variation among the plurality of exposure results of the column sections 120. Yet further, the exposure apparatus 100 may position the array beam and line pattern of the chip being irradiated by the array beam for each column section 120, such that the column sections 120 respectively expose the cut patterns associated with different semiconductor chips on a single sample 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure apparatus comprising:
   a beam generator that generates a plurality of charged particle beams having different irradiation positions in a width direction of a line pattern on a sample;
   a blanking electrode to selectively irradiate the sample at designated irradiation positions in a longitudinal direction on the line pattern;
   a stage adapted to have a sample mounted thereon and move the sample relative to the plurality of charged particle beams;
   a detector that detects a position of the stage; and
   a plurality of deflectors to separately deflect the plurality of charged particle beams.

2. The exposure apparatus according to claim 1, wherein:
   the plurality of deflectors are adapted and arranged to deflect the plurality of charged particle beams based on a difference between the detected position of the stage and a predicted position of the stage corresponding to a predicted drive amount.

3. The exposure apparatus according to claim 2, wherein the predicted drive amount is based on an average movement velocity from a plurality of detected positions of the stage, and time that has passed from when the detector detects the position of the stage.

4. The exposure apparatus according to claim 3, wherein the detector is adapted and arranged to sequentially detect positions of the stage, and
   the average movement velocity from the plurality of detected positions of the stage is sequentially calculated and updated.

5. The exposure apparatus according to claim 2, wherein the plurality of deflectors separately deflect the plurality of charged particle beams based on a component obtained by decreasing a frequency component that is less than a predetermined frequency in a difference between the predicted position of the stage and the detected position of the stage.

6. The exposure apparatus according to claim 2, wherein the stage adjusts movement of the sample based on a detected position that is based on a detection signal obtained by decreasing a component that is greater than or equal to a predetermined frequency in the detection signal to detect the position of the stage.

7. The exposure apparatus according to claim 2, wherein the plurality of deflectors separately deflect the plurality of charged particle beams based on a difference between the predicted position of the stage and the detected position of the stage and on a movement position of the sample corresponding to a predetermined delay time.

8. The exposure apparatus according to claim 1, wherein the beam generator generates the plurality of charged particle beams having different irradiation positions in a width direction of a line pattern on the sample,
   the stage scans irradiation positions of the plurality of charged particle beams along a longitudinal direction of the line pattern, and
   the blanking electrode is further configured to select at least one charged particle beams to irradiate the sample from among the plurality of charged particle beams, at a designated irradiation position in the longitudinal direction of the line pattern, and to control the selected at least one charged particle beam to irradiate the sample.

9. An exposure method for irradiating a sample with a charged particle beam, comprising:

generating, with a beam generating section, the charged particle beam;

moving, with a stage section that has a sample mounted thereon, the sample relative to the beam generating section;

detecting a position of the stage section;

generating a predicted drive amount obtained by predicting a drive amount of the stage section based on a detected position of the stage section;

performing irradiation control for irradiating the sample with the charged particle beam, based on the predicted drive amount, including controlling a time during which the sample is irradiated with the charged particle beam, such that an exposure amount distribution draws near a predetermined target for the exposure amount distribution, and deflecting the charged particle beam based on a difference between the detected position of the stage section and a predicted position of the stage section corresponding to the predicted drive amount.

10. An exposure method for irradiating a sample with a charged particle beam, comprising:

generating, with a beam generating section, the charged particle beam;

moving, with a stage section that has a sample mounted thereon, the sample relative to the beam generating section;

detecting a position of the stage section;

generating a predicted drive amount obtained by predicting a drive amount of the stage section based on a detected position of the stage section; and performing irradiation control for irradiating the sample with the charged particle beam, based on the predicted drive amount, wherein the performing irradiation control includes controlling an irradiation amount of the charged particle beam based on a difference between a movement velocity of the stage section and a predicted movement velocity of the stage section.

* * * * *